United States Patent
Nagao et al.

(10) Patent No.: US 6,670,541 B2
(45) Date of Patent: Dec. 30, 2003

(54) SOLAR BATTERY, SOLAR GENERATING APPARATUS, AND BUILDING

(75) Inventors: Yoshitaka Nagao, Kyoto (JP); Masahiro Mori, Kyoto (JP); Yuji Inoue, Nara (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/984,093

(22) Filed: Oct. 29, 2001

(65) Prior Publication Data

US 2002/0078991 A1 Jun. 27, 2002

(30) Foreign Application Priority Data

Oct. 31, 2000 (JP) ........................ 2000/333683

(51) Int. Cl.[7] .................. H01L 31/05; H01L 31/042
(52) U.S. Cl. .................. 136/251; 136/244; 136/291; 257/433; 52/173.3
(58) Field of Search .................. 136/251, 244, 136/291; 52/173.3; 257/433

(56) References Cited

U.S. PATENT DOCUMENTS

| 4,392,009 A | * 7/1983 | Napoli ........................ 136/251 |
| 6,025,555 A | 2/2000 | Mori et al. .................. 136/251 |
| 6,075,201 A | * 6/2000 | Wambach .................... 136/251 |
| 6,111,189 A | * 8/2000 | Garvison et al. ............ 136/244 |
| 2002/0179140 A1 | * 12/2002 | Toyomura .................... 135/251 |

FOREIGN PATENT DOCUMENTS

| JP | 11-22127 A | * 1/1999 |
| JP | 11-44070 A | * 2/1999 |
| JP | 11-54778 A | * 2/1999 |
| JP | 2001-94137 A | * 4/2001 |
| JP | 2001-339087 A | * 12/2001 |

* cited by examiner

*Primary Examiner*—Alan Diamond
(74) *Attorney, Agent, or Firm*—Fitzpatrick, Cella, Harper & Scinto

(57) ABSTRACT

When a plurality of solar battery modules are to be connected, terminals formed on the rear surfaces of these solar battery modules are connected by electric wires. This wiring is very cumbersome work, so power output wires from a plurality of solar battery modules get tangled together to cause connection errors. In a solar battery module including a cover member for supporting a photovoltaic element, and a structure support member having a portion which forms an angle or a curved surface with respect to the cover member, an electric connecting terminal is formed at an opening of the structure support member, and a locking member at least partially formed by a continuous body is inserted into the structure support member. In this way, the solar battery module is fixed and/or electrically connected.

11 Claims, 39 Drawing Sheets

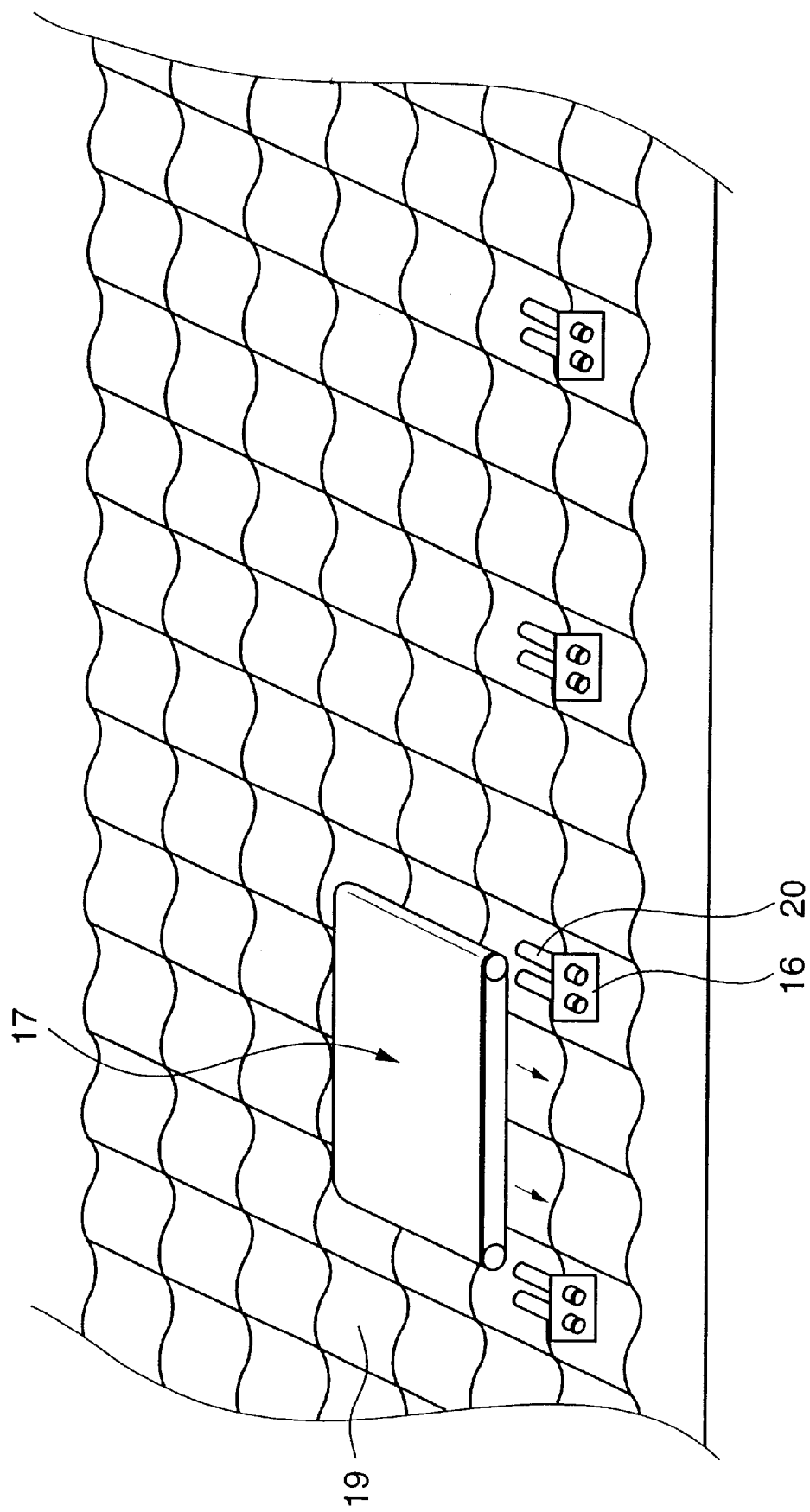

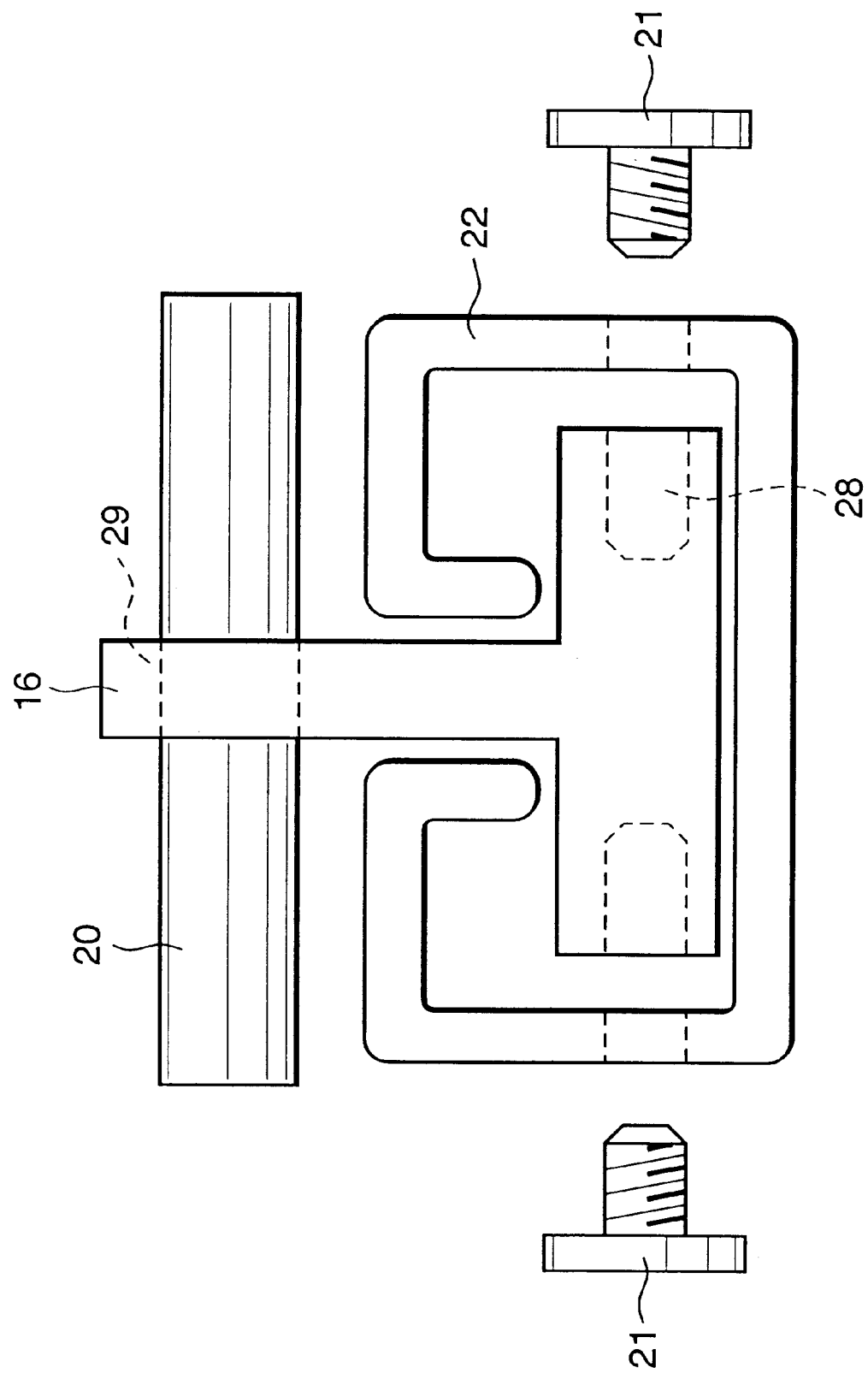

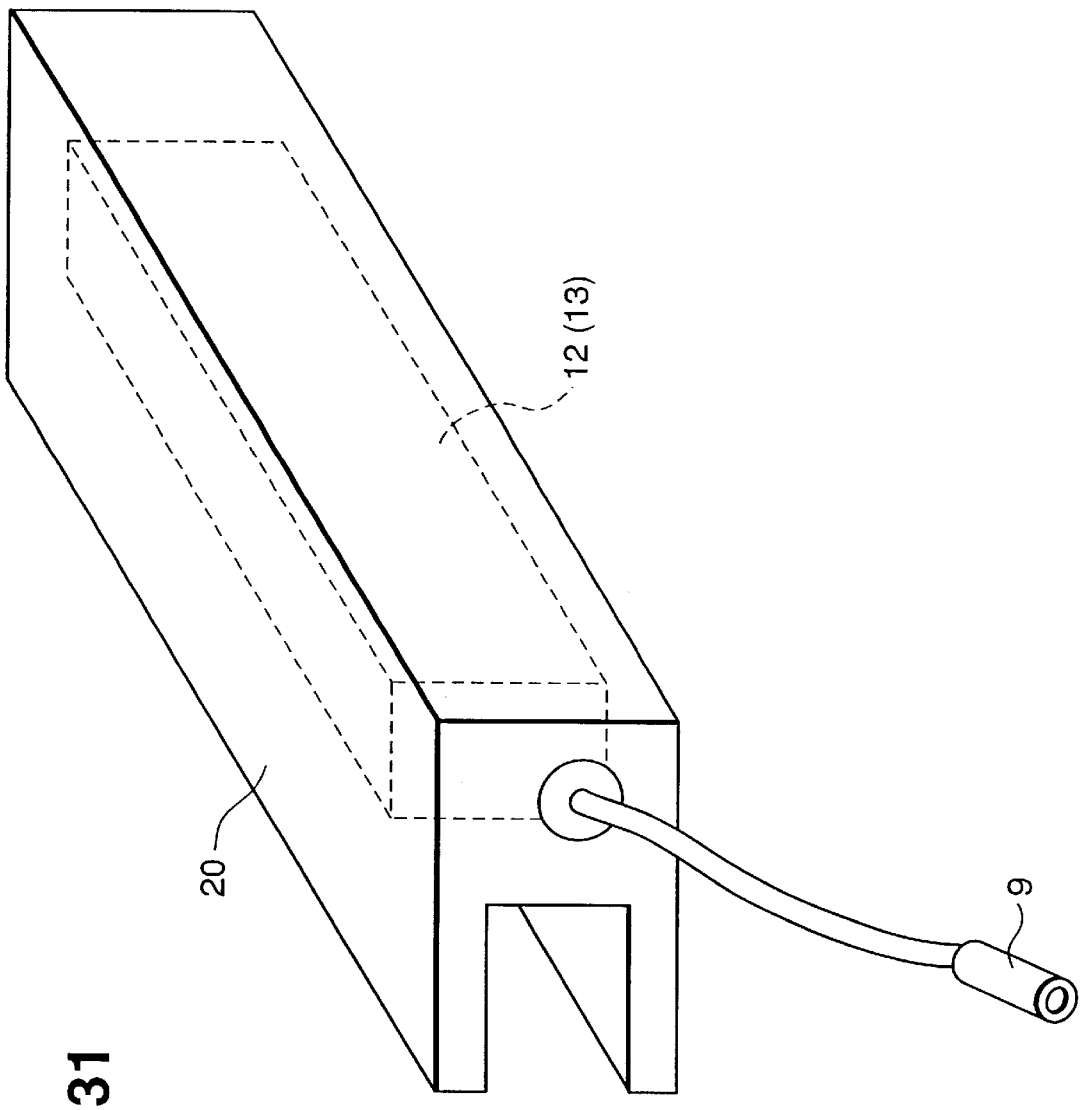

FIG. 32A
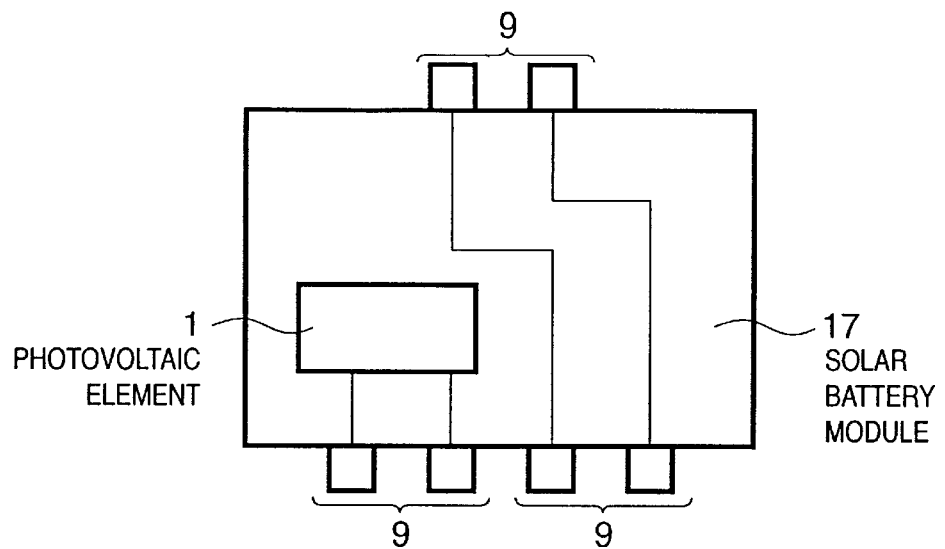
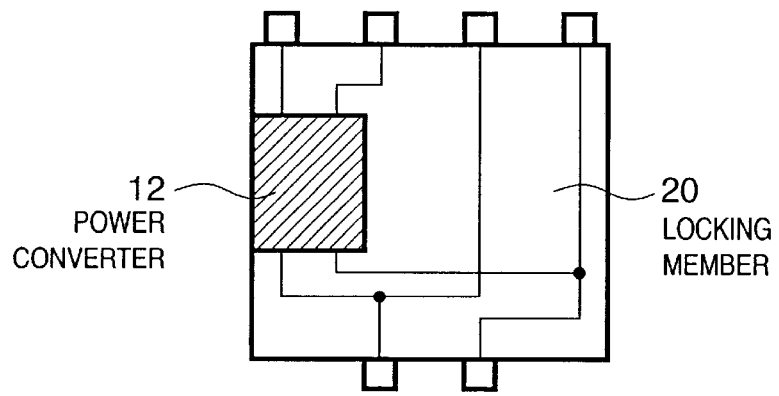
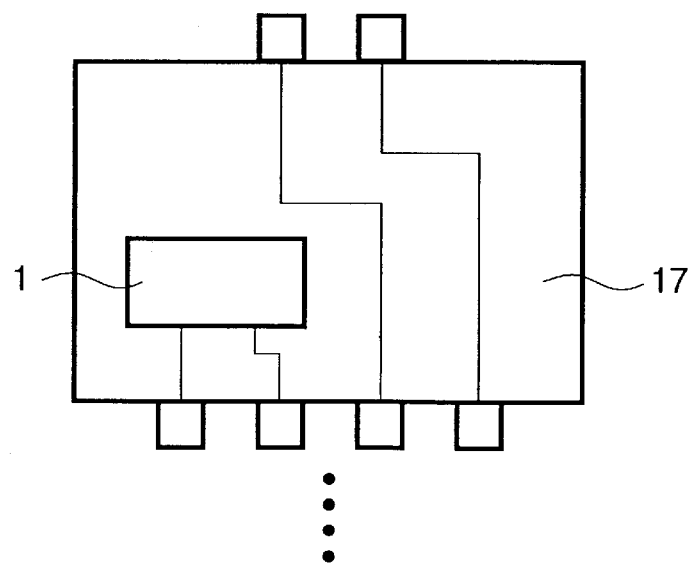

FIG. 32B
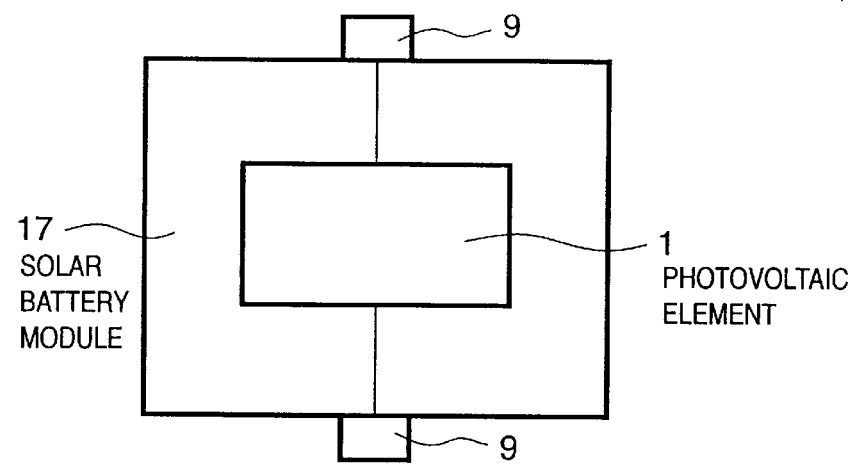
17 SOLAR BATTERY MODULE
1 PHOTOVOLTAIC ELEMENT
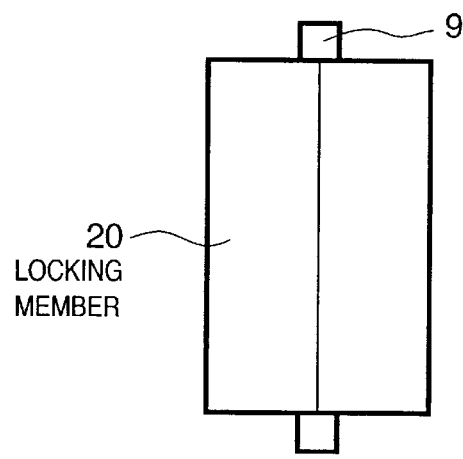
20 LOCKING MEMBER
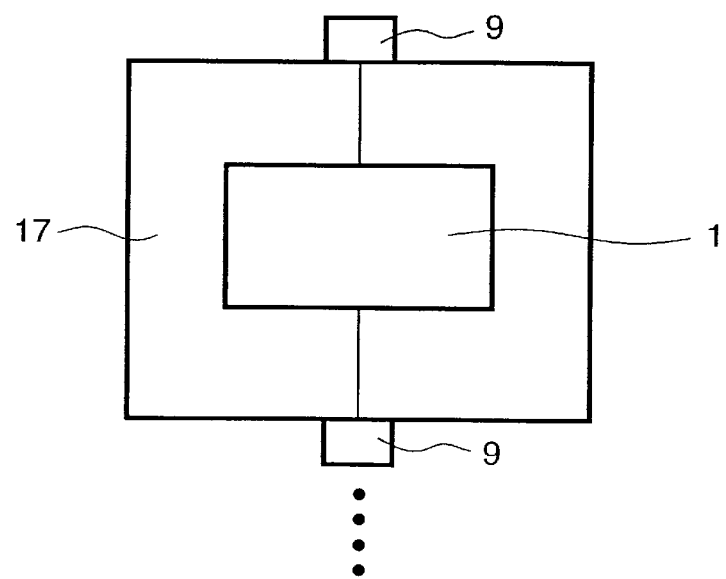

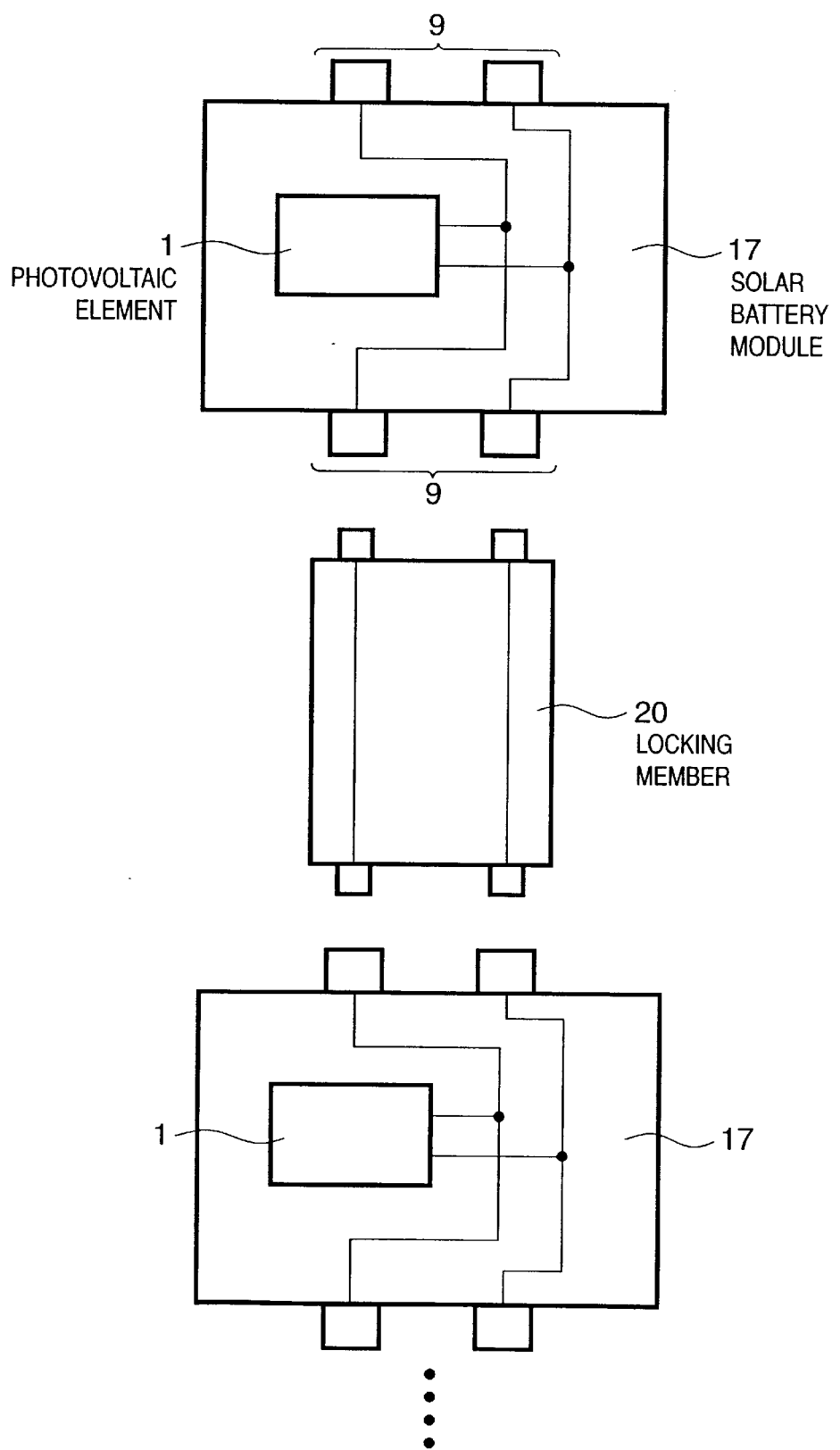

FIG. 32D
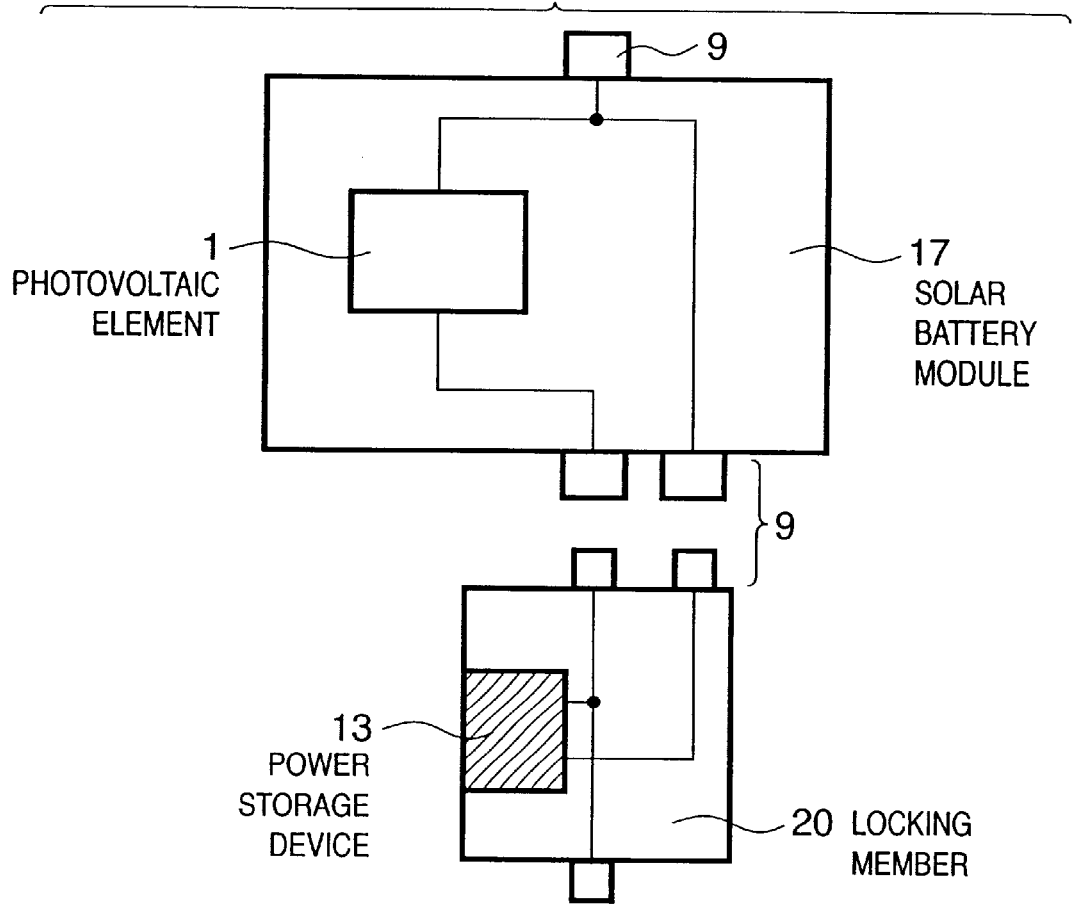
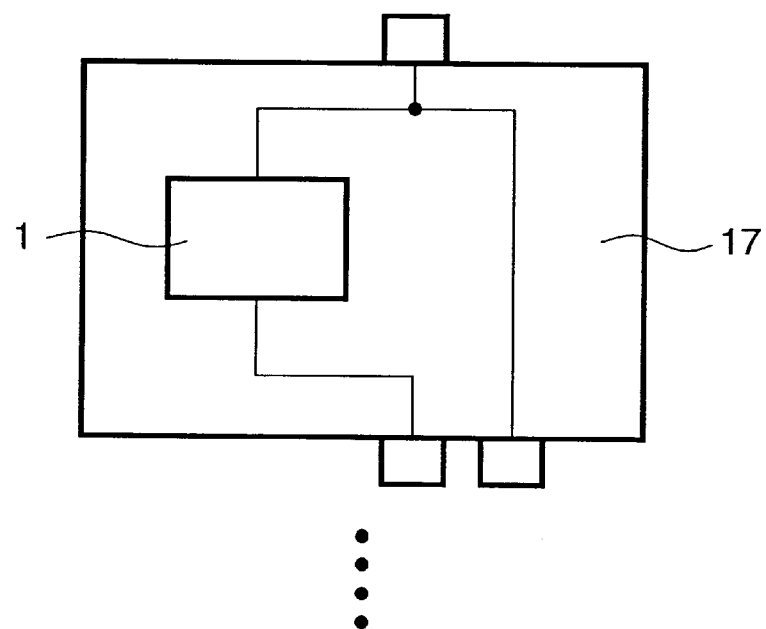

SOLAR BATTERY, SOLAR GENERATING
APPARATUS, AND BUILDING

FIELD OF THE INVENTION

The present invention relates to a solar battery, a solar generating apparatus using the solar battery, and a building equipped with the solar generating apparatus.

BACKGROUND OF THE INVENTION

Recently, global warming, exhaustion of fossil fuel, and radioactive contamination by nuclear power plant accidents and radioactive waste are becoming subjects of discussion, so terrestrial environment and energy are rapidly getting popular. Under the circumstances, a solar battery is expected as an inexhaustible, clean energy source. Systems using solar batteries have various scales from a few watts to a few thousands of kilowatts, and also have various types. Examples are a system directly using electric power, a system in which electricity is stored in a battery, and a system which uses a solar battery in combination with a commercial power system. In recent years, solar generating apparatuses which can be installed on the roof of a house have been proposed and are spreading.

Another system is possible in which a small-sized power converter called an MIC (Module Integrated Converter) which converts DC power from a solar battery into AC power is attached to each solar battery module to thereby extract AC power and supply this AC power directly to wall outlets of a house. This system simplifies the construction of electrical connections and the installation of a solar generating apparatus. Also, cost down by the mass-production effect of the MIC is expected.

A solar battery module usually has a box called a terminal box which contains a terminal base for connecting a power output wire. When a plurality of solar battery modules are to be connected, these terminal bases are connected to each other. This wiring is very cumbersome work, so power output wires from a plurality of solar battery modules get tangled together to cause connection errors. Also, each solar battery module must be so installed as to leave a wiring space on the rear surface of the module.

From this viewpoint, Japanese Patent Laid-Open No. 11-22127 discloses a structure in which a frame for mounting a solar battery module is equipped with a wiring duct and connecting terminals, and connecting terminals of a solar battery module are connected to the connecting terminals of the frame. Additionally, Japanese Patent Laid-Open No. 11-44070 discloses a technique by which solar battery modules are fitted in each other.

In the electrical connecting portion of the above prior art, however, it is necessary to ensure high water resistance and take special care to obtain high long-term reliability so that the contact resistance does not rise. Also, after electrical connections are made, each solar battery module must be fixed by using another fixing member. When solar battery modules are fitted in each other, therefore, caution should be exercised on the electrical resistances of wiring materials because the internal circuits are connected in parallel.

SUMMARY OF THE INVENTION

The present invention individually or collectively solves the above problems, and has as its object to improve the installation efficiency and water resistance of a solar generating apparatus.

To achieve the above object, a preferred embodiment of the present invention discloses a solar battery comprising a photovoltaic element; a cover member for supporting the photovoltaic element; and a structure support member having a portion which forms an angle or a curved surface with respect to the cover member. The structure support member has an opening and an electric connecting terminal. The solar battery is fixed and/or electrically connected to the outside by inserting, into the opening, a locking member at least partially formed by a continuous body.

Other features and advantages of the present invention will be apparent from the following description taken in conjunction with the accompanying drawings, in which like reference characters designate the same or similar parts throughout the figures thereof.

BRIEF DESCRIPTION OF THE DRAWINGS

The accompanying drawings, which are incorporated in and constitute a part of the specification, illustrate embodiments of the invention and, together with the description, serve to explain the principles of the invention.

FIG. 30 is a view showing a mounting member of the solar battery module of the third embodiment;

FIG. 31 is a view showing an example of a locking member of the embodiment; and

FIGS. 32A to 32E are views showing circuits for connecting a plurality of solar battery modules when a power converter is housed in the locking member.

DETAILED DESCRIPTION OF THE PREFERRED EMBODIMENTS

A solar generating apparatus of an embodiment according to the present invention will now be described in detail in accordance with the accompanying drawings.

[Arrangement]

Figure 1:
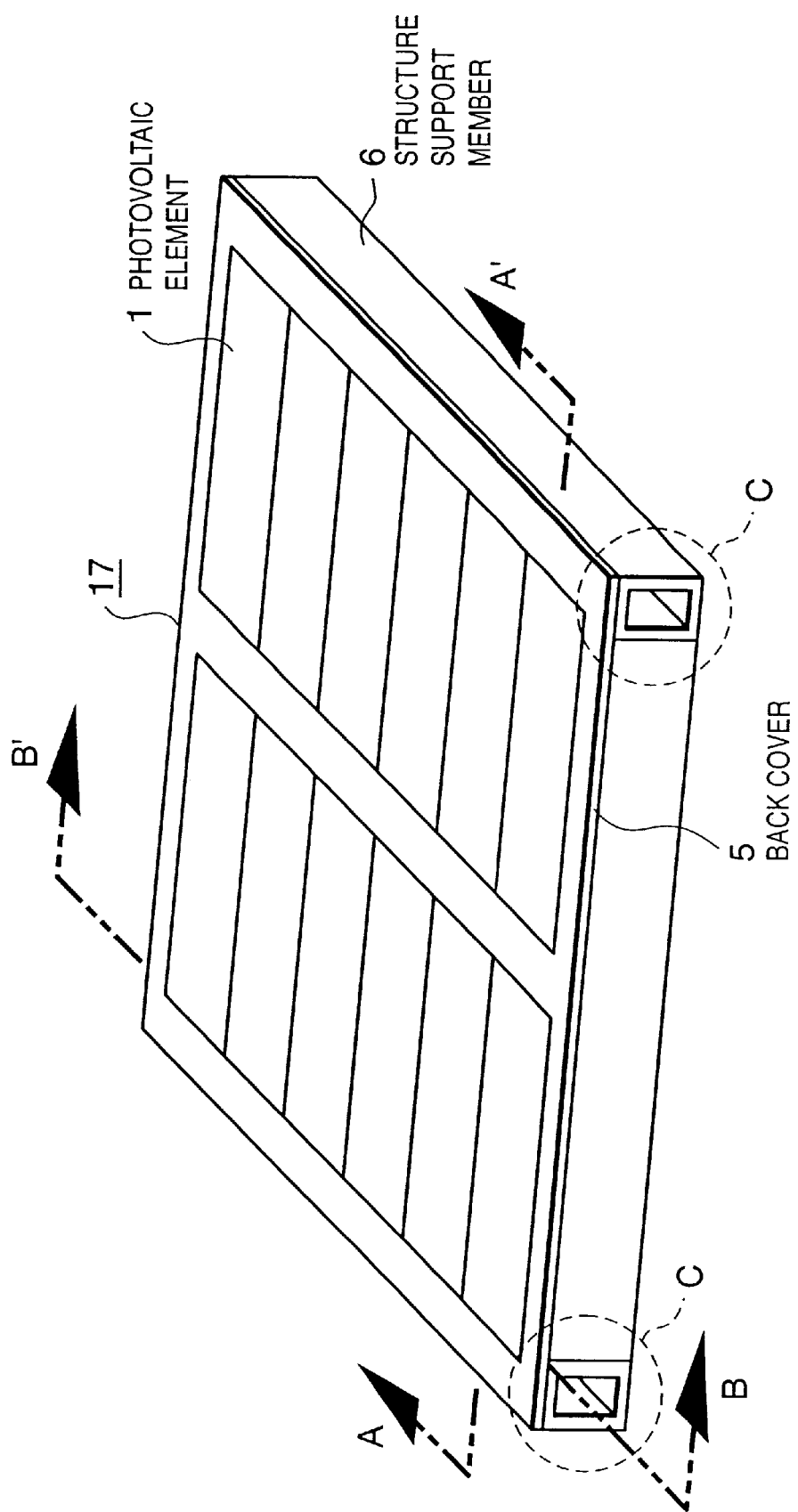
FIG. 1 is a perspective view showing the arrangement of a solar battery module of an embodiment.
Figure 2:
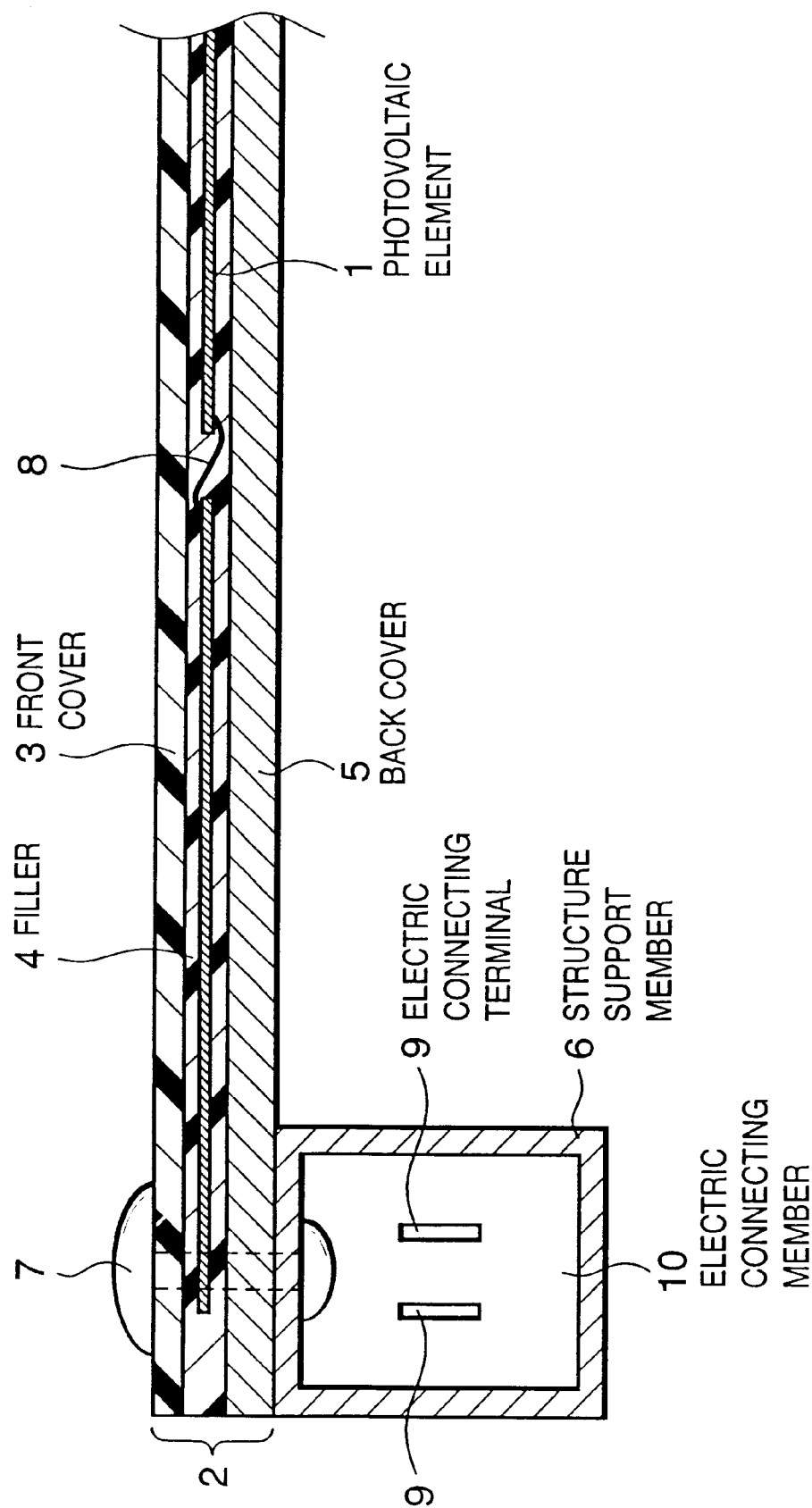
FIG. 2 is a schematic sectional view showing the arrangement of the solar battery module of the embodiment.
Figure 3:
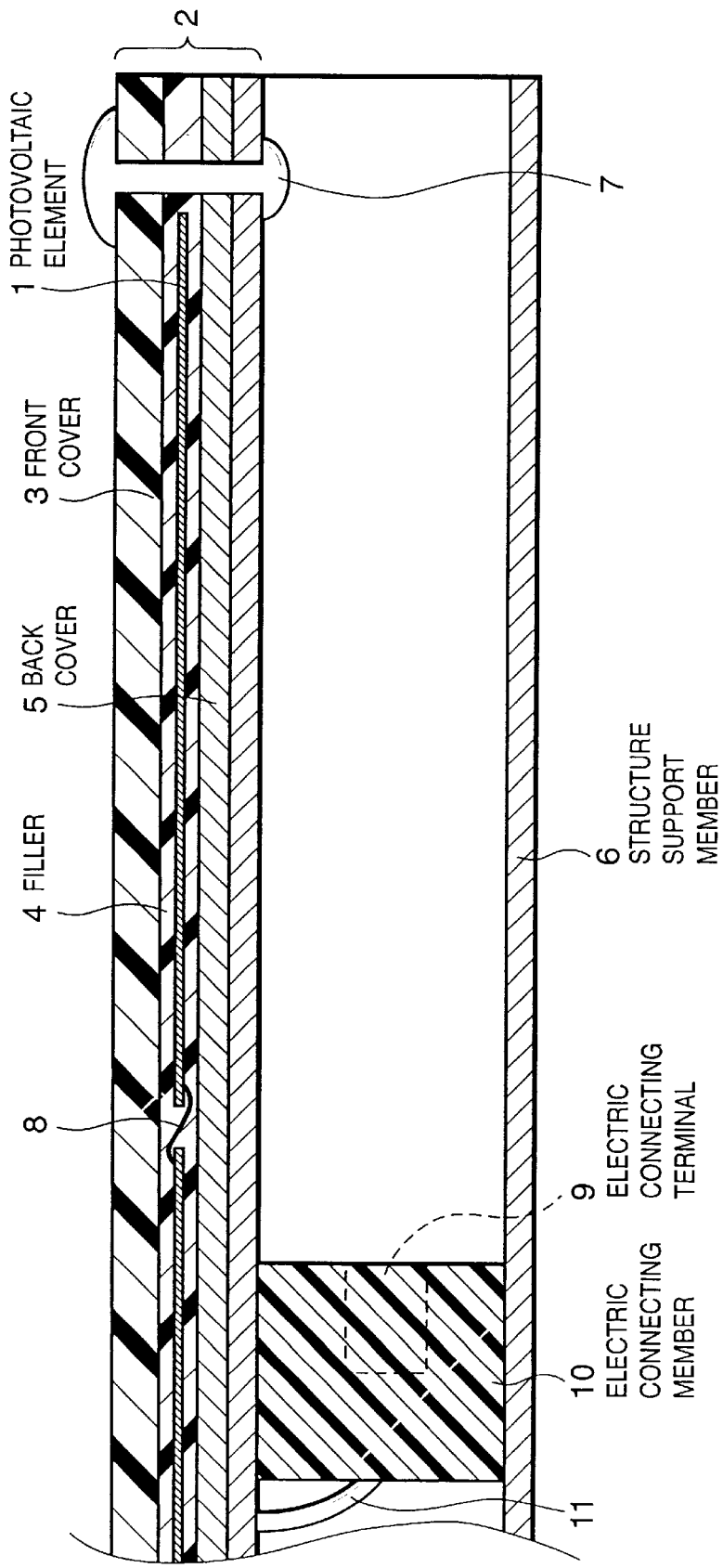
FIG. 3 is a sectional view of a structure support member.

FIG. 1 is a perspective view showing the arrangement of a solar battery module 17 of the embodiment. FIGS. 2 and 3 are schematic sectional views taken along lines A–A' and B–B', respectively, in FIG. 1.

This solar battery module 17 has a structure in which photovoltaic elements 1 are encapsulated in an enclosure made up of, e.g., a front cover 3 having environmental resistance, a filler 4, and a back cover 5, and structure support members 6 are attached to the circumference of this enclosure. An electric connecting member 10 is attached to a portion which is not exposed to rain and the like on the back side of this solar battery module 17. This electric connecting member 10 has electric connecting terminals 9 connected to a power output wire 11 for extracting electric power of the solar battery module 17.

Figure 6:
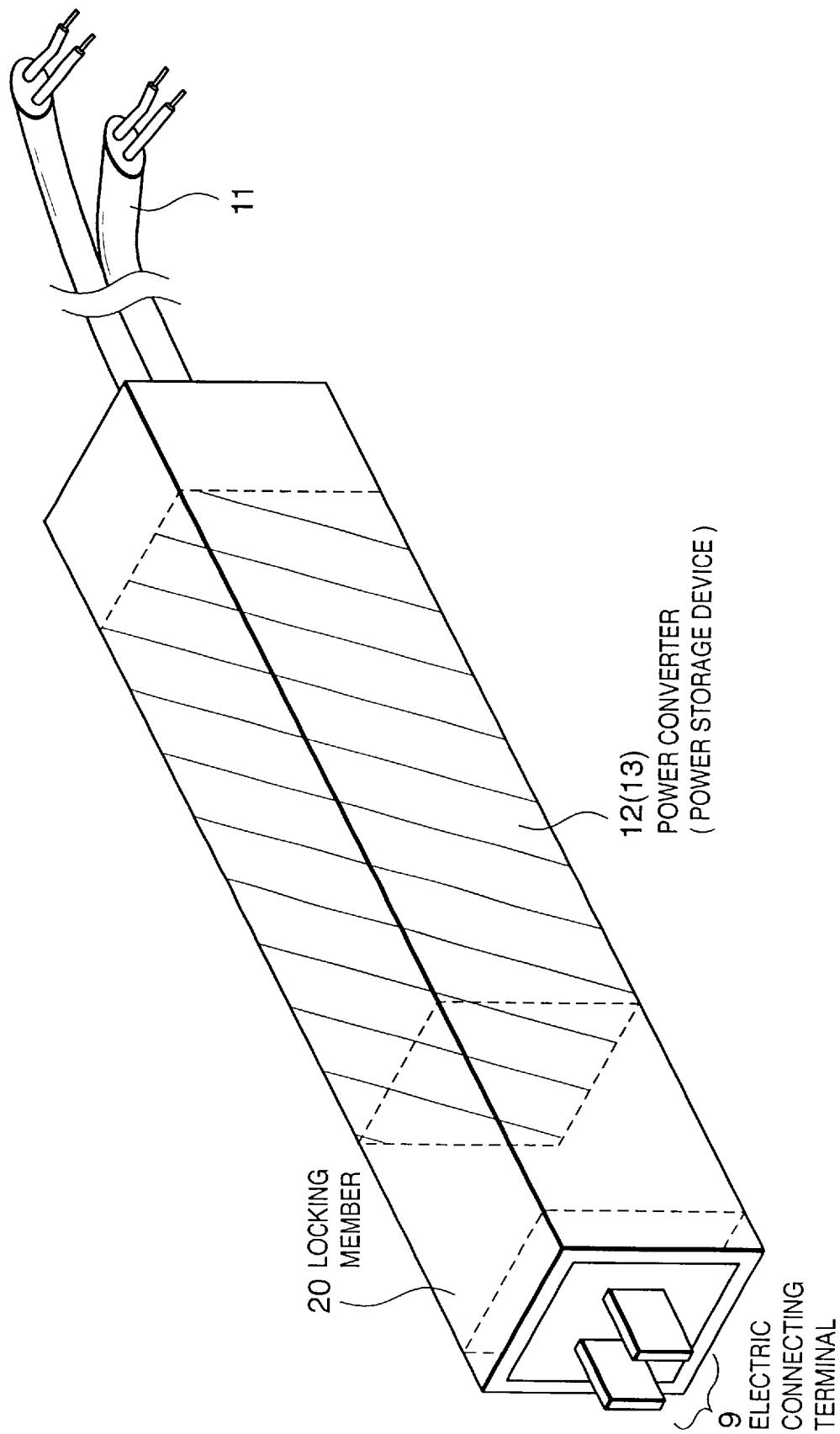
FIG. 6 is a perspective view showing a locking member of the solar battery module.
Figure 8:
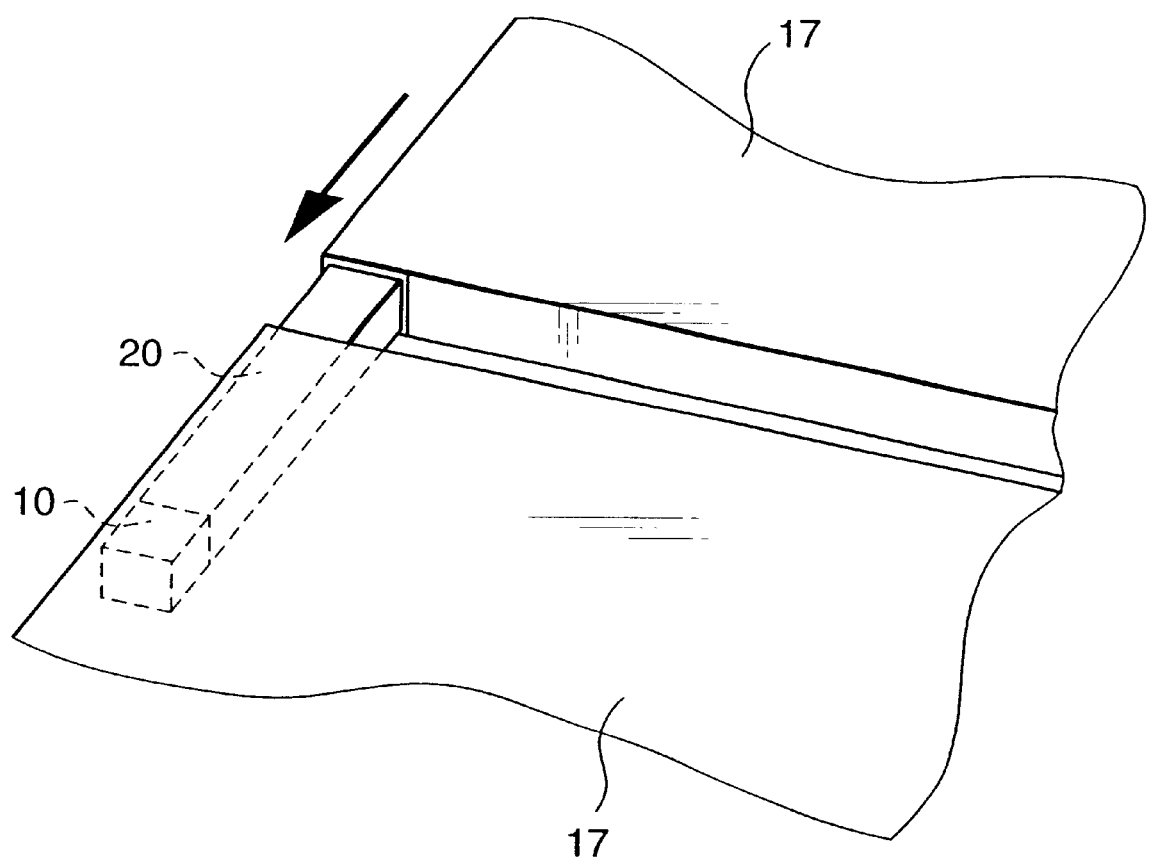
FIG. 8 is a view showing the way solar battery modules are connected.

FIG. 6 is a view showing a locking member 20. FIG. 8 is a view showing the state in which solar battery modules are connected by this locking member 20.

Photovoltaic Element

The photovoltaic element 1 is not particularly restricted, so silicon semiconductors, compound semiconductors, and the like can be used. Of silicon semiconductors, it is possible to use single-crystal silicon, polysilicon, amorphous silicon, thin-film polysilicon, and the combination of these.

In the solar battery module 17, several photovoltaic elements 1 can be connected in series or parallel by a conductive material called an interconnector 8, in order to obtain a desired voltage and current. However, this interconnector 8 is unnecessary if a stacked structure is improved using a technology such as laser scribing. Also, the photovoltaic element 1 itself can be a wafer-like photovoltaic element or a photovoltaic element using stainless steel, glass, or a film as its substrate.

Cover Members

Cover members 2 are used to protect the photovoltaic element 1. A cover member placed on the light-receiving surface side of the photovoltaic element 1 is called a front cover 3, a cover member placed on the non-light-receiving surface side is called a back cover 3, and a material which fills the space in which the photovoltaic element 1 is placed between the front cover 3 and the back cover 5 is called a filler 4. Generally, both the front cover 3 and the back cover 5 are used as the cover members 2. However, these covers can also be selectively used in accordance with the structure and the use environment of the photovoltaic element 1.

Front Cover

The front cover 3 is positioned on the outermost surface of the solar battery module 17. This front cover 3 is used as an enclosure for protecting the solar battery module 17 from, e.g., external contamination, scratches, and humidity. Accordingly, the front cover 3 is required to have high transparency, high weather resistance, high contamination resistance, and high mechanical strength. Examples of a material which meets these requirements and can be suitably used are glass, a fluorine resin film, and an acrylic resin film.

Especially when a resin film is used, the front cover 3 is not broken by external impact. Additionally, since a resin film is a material much lighter than glass, the weight of the solar battery module 17 can be reduced. That is, especially when the solar battery module 17 is installed on a roof, the earthquake resistance of the building can be improved. Furthermore, the surface reflection of solar light can be reduced by embossing the film surface. A resin film is also readily processable in the building site. From these points of view, a resin film is preferably used as a surface member.

A fluorine resin film is particularly favorable because the film is especially superior in weather resistance and contamination resistance. Practical examples are a polyvinylidene fluoride resin, polyvinyl fluoride resin, and ethylene tetrafluoride-ethylene copolymer. Although the polyvinylidene fluoride resin is particularly superior in weather resistance, the ethylene tetrafluoride-ethylene copolymer is superior in both weather resistance and mechanical strength and in transparency. To improve the adhesion to the resin used as the filler 4, it is desirable to perform surface treating for the film. Examples are corona treating, plasma treating, ozone treating, UV irradiation, electron beam irradiation, and flame treating. It is also possible to use an integrated material, such as a self-adhesive sheet, of a surface member and a filler.

When a glass plate is used as a substrate of the photovoltaic element 1, this glass plate can also function as the front cover 3 if used on the light-receiving surface side. The front cover 3 can be omitted if the filler 4 well satisfies necessary weather resistance, contamination resistance, and mechanical strength owing to a location in which the solar battery module is used, or when a contamination preventing layer such as an optical catalyst is used on the surface.

Filler

The filler 4 is an insulating material for encapsulating the photovoltaic element 1 and the interconnector 8 into the enclosure and protecting the photovoltaic element 1. This filler 4 is used to cover projections and recesses of the photovoltaic element 1 and the interconnector 8 with a resin, protect the photovoltaic element 1 from severe external environment such as temperature changes, humidity, and impact, and ensure the adhesion of the photovoltaic element 1 to the front cover 3 (front surface member) and the back cover 5 (rear surface member). Therefore, the filler 4 must have high weather resistance, high adhesion, good filling properties, high heat resistance, high freeze resistance, and high impact resistance. Practical examples of a resin meeting these requirements are an ethylene-vinyl acetate copolymer (EVA), ethylene-methyl acrylate copolymer (EMA), ethylene-ethyl acrylate copolymer (EEA), and polyvinyl butyral resin. Of these resins, EVA is most widely used as a covering material of conventional solar battery modules, so high reliability is obtained without largely changing the arrangement of the conventional filler. Since EVA is also inexpensive, EVA is the most preferred material.

An adhesive or sticking material can also be used as the filler 4 when the photovoltaic element 1 has weather resistance and hence need not be encapsulated, i.e., when the photovoltaic element 1 is adhered to a covering portion and only adhesion to this covering portion is necessary. Practical examples of the adhesive or sticking material are rubber-, silicon-, acryl-, and vinylether-based materials. Of these materials, silicon- and acryl-based materials are particularly favorable because they are superior in heat resistance, weather resistance, and electrical insulating properties. The adhesive or sticking material is used on the entire surface or in several portions of a covering portion to obtain a predetermined adhesion. It is of course also possible to combine the above materials as a filler.

Furthermore, to assure electrical insulation between the photovoltaic element 1 and the outside, an insulating film can also be inserted as an insulating layer in the filler 4. Commonly, electrical insulation can be maintained only by filling the rear surface with an organic polymer resin. However, a short circuit may occur if the thickness of the organic polymer resin easily varies owing to the structure of the photovoltaic element 1, or if a conductive member is used as the back cover 5. The use of an insulating film can further ensure the safety in these cases.

As a film material, a flexible material capable of assuring sufficient electrical insulation to the outside, having high long-term durability, and resistant against thermal expansion and thermal shrinkage is preferred. Examples of a suitably usable film are nylon, polyethyleneterephthalate, and polycarbonate.

To help deaeration in the manufacturing process, a sheet member constructed of a fiber material can be inserted. Examples of the material are glass fiber nonwoven fabric and glass fiber woven fabric. Of these two materials, glass fiber nonwoven fabric is preferred because it is inexpensive and, if a thermoplastic resin is used as a filler, portions between glass fibers can be readily filled with this thermoplastic resin.

Back Cover

The back cover 5 functions as a material for protecting the rear surface of the photovoltaic element 1 or as a reinforcing material. Although the material is not particularly limited, it is possible to use, e.g., a film formed by sandwiching an aluminum foil between fluorine-based resins, a film sandwiched between aluminum foils, fibers mixed with a resin, glass, a metal plate, plywood, a calcium silicate plate, a glass fiber mixed cement plate, various concrete plates such as lightweight cellular concrete, and resin plates such as acryl and polycarbonate.

When a metal plate is used as the back cover 5, this back cover 5 is light in weight and particularly effective in preventing fire. General examples of the metal plate are a molten zinc plated steel plate, molten zinc-5% aluminum alloy plated steel plate, molten zinc-55% aluminum alloy plated steel plate, molten aluminum plated steel plate, zinc electroplated steel plate, alloy electroplated steel plate, copper electroplated steel plate, deposited zinc plated steel plate, molten zinc plated stainless steel plate, molten aluminum plated stainless steel plate, copper electroplated stainless steel plate, hot-rolled stainless steel plate, cold-rolled stainless steel plate, vinyl chloride covered steel plate, fluorine resin steel plate, vibration-damping steel plate, heat-insulating zinc iron plate, weather-resistant steel plate, and coated steel plate described above. Examples of non-ferrous metals are a copper plate, aluminum alloy plate, zinc iron plate, lead plate, titanium plate, and coated color plate described above.

Structure Support Member

The structure support member 6 is attached or formed to give the solar battery module 17 rigidity against torsion and bending.

Examples of the material of the member to be attached are a round pipe, square pipe, and extruded member of aluminum, stainless, and iron, plastic, and a member obtained by bending or molding a cover member. If the back cover 5 is a metal, it is also possible to bend this back cover 5 to form a shape capable of maintaining structural strength, and integrate the back cover 5 thus shaped with the structure support member 6.

Figure 23:
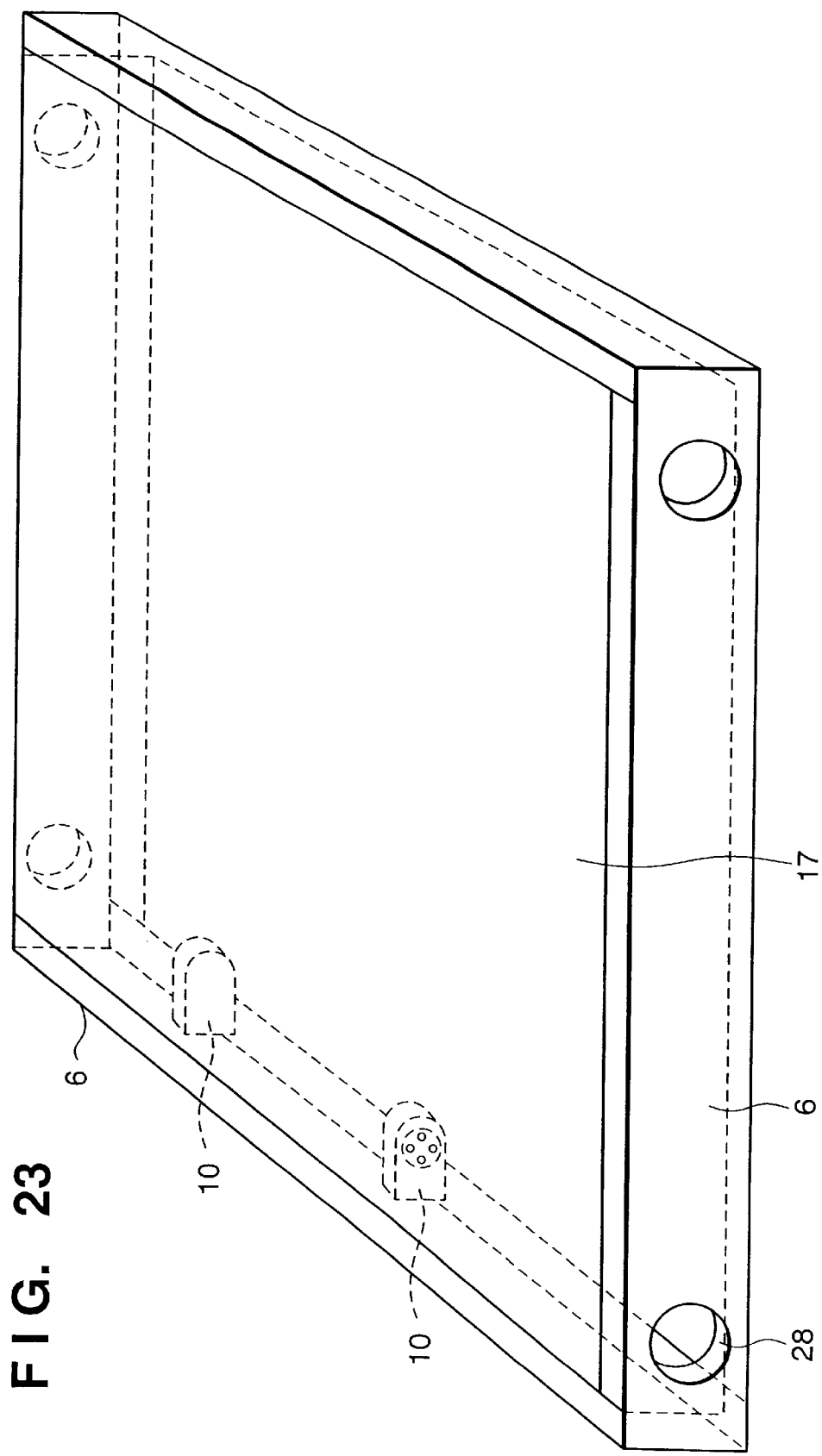
FIG. 23 is a perspective view of a solar battery module of the third embodiment.

The sectional shape of this structure support member 6 is desirably a circle, square, or U-shape. However, the structure support member 6 can take any shape provided that the shape has structural strength. Also, the section of this structure support member 6 is preferably exposed as shown in FIG. 1, because a pipe serving as the locking member 20 can be readily connected, and this locking member 20 does not easily come off even when applied with a large load. Alternatively, as shown in FIG. 23, holes 28 can be formed in the structure support member 6 to insert the locking members 20 into these holes. Consequently, the frame that has been conventionally necessary can be made unnecessary or simplified.

Figure 16:
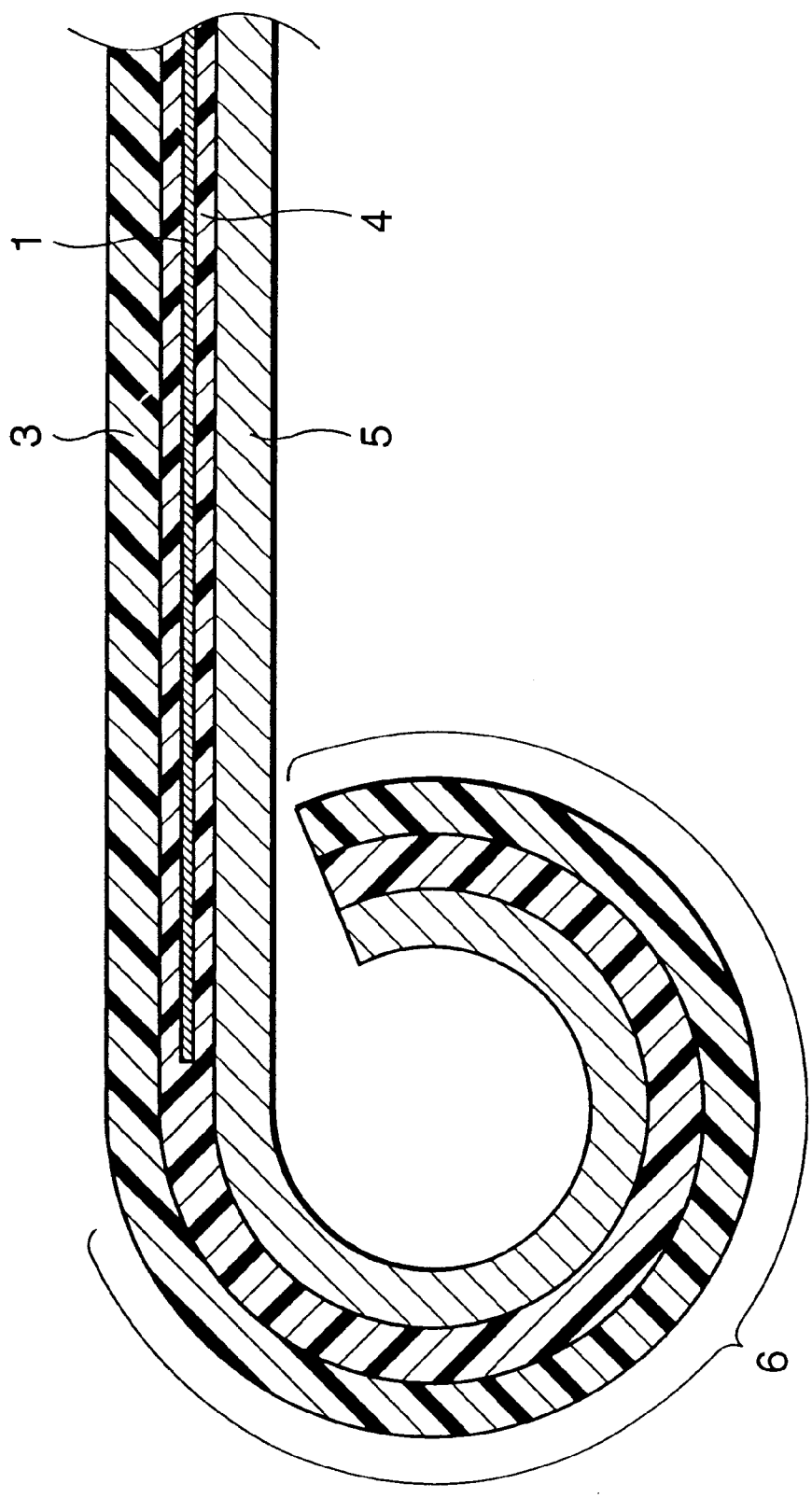
FIG. 16 is a schematic sectional view of the solar battery module of the second embodiment.

The shape of the section of this structure support member 6 is desirably closed. However, as shown in FIG. 16, if the metal-plate back cover 5 is bent to be integrated with this structure support member 6, the sectional shape need not be closed. This can reduce the number of steps of attaching members and the number of members themselves.

When the structure support member 6 is attached as a discrete member to the cover member 2, they can be connected by welding, riveting, bolts, a gasket, or an adhesive. However, any method can be used provided that these members are reliably connected and are not separated even upon application of a required load.

Electric Connecting Terminal

The electric connecting terminals 9 can take any structure provided that they are attached to the electric connecting member 10 of the solar battery module 17 and the locking member 20 and can electrically connect these members by coming into contact with each other. Desired examples are: a structure in which the electric connecting terminals 9 are brought into contact with each other by inserting the locking member 20 shown in FIG. 6 into the electric connecting member 10 shown in FIG. 4; a structure of the electric connecting terminals 9 shown in FIGS. 17 and 19 in which the metals of threaded portions and terminals attached to the end portions (these members construct the electric connecting terminals 9) come into contact with each other when they are screwed; and a structure shown in FIGS. 24 and 25 in which the electric connecting terminals 9 are brought into contact with each other and fixed when inserted and rotated 90°. Note that the projecting electric connecting terminals 9 are attached to the locking members 20 in these drawings, but they can also be attached to the electric connecting members 10.

Electric Connecting Member

The electric connecting member 10 has the electric connecting terminals 9 for finally extracting outputs from the photovoltaic elements 1 connected by a conductive material called an interconnector 8 to the outside of the solar battery module 17, and for connecting electric power from another solar battery module 17, in order to obtain a desired voltage and current in the solar battery module 17. This electric connecting member 10 can take any structure as long as it can contact and electrically connect to the electric connecting terminals 9 attached to the locking member 20. A particularly desired structure of the electric connecting member 10 is that the electric connecting terminals 9 are electrically connected when the locking member 20 is inserted.

Figure 5:
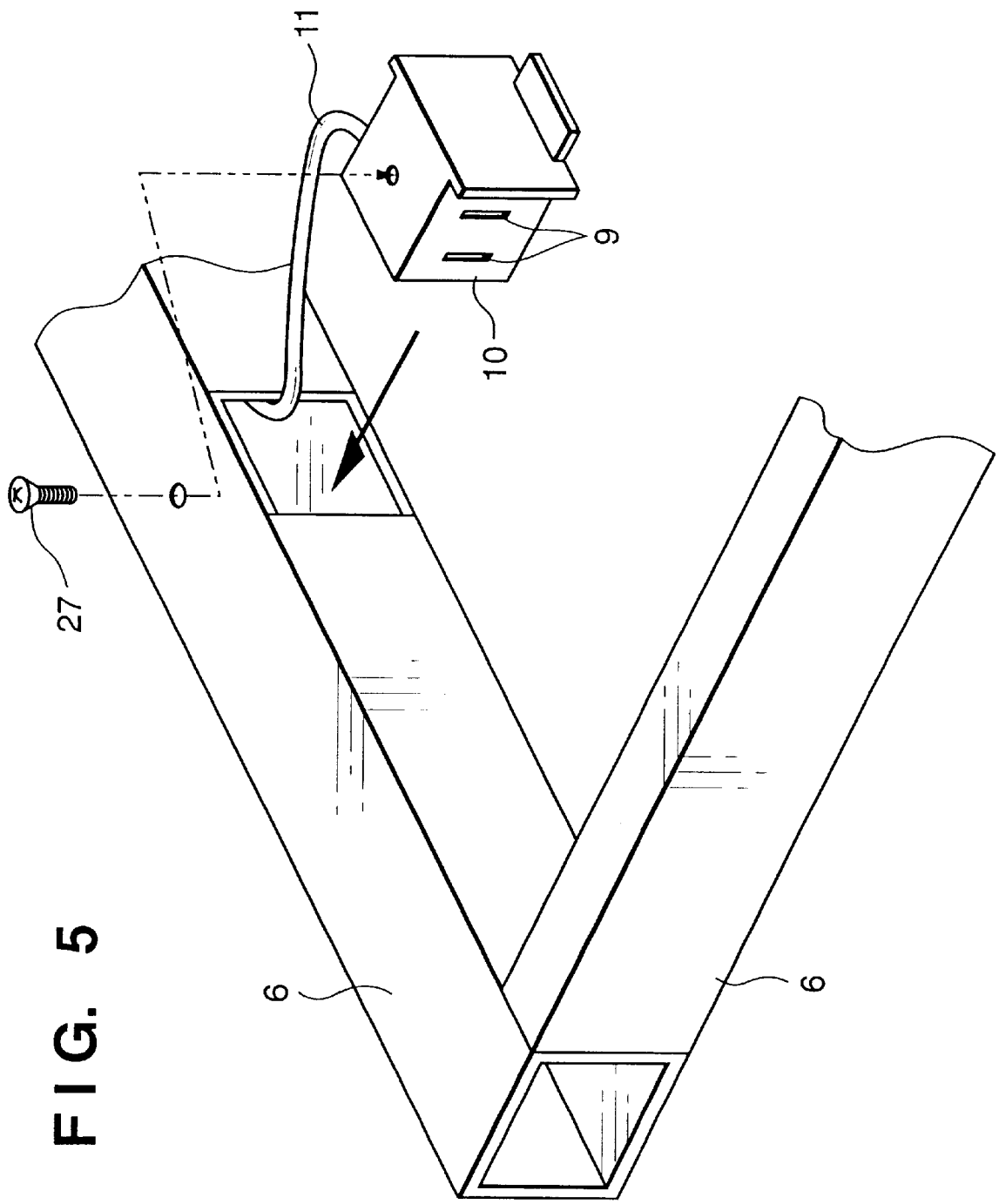
FIG. 5 is a view for explaining how to attach the electric connecting terminals of the solar battery module.

The electric connecting member 10 is attached to a part of the structure support member 6 on the rear surface side of the solar battery module 17. Alternatively, as shown in FIG. 5, the electric connecting member 10 is inserted from an opening in the structure support member 6 and fixed by a machine screw 27 or the like.

Power Output Wire

The power output wire 11 is a wiring material for guiding electricity from the output terminal of the solar battery module 17 to the outside.

This power output wire 11 is not particularly restricted. It is necessary to select a material having heat resistance, freeze resistance, mechanical strength, electrical insulation properties, water resistance, oil resistance, wear resistance, acid resistance, and alkali resistance required in accordance with the use environment. Examples are insulated wires such as IV, KIV, HKIV, crosslinked polyethylene, fluorine rubber, silicone rubber, and fluorine resin. As the power output wire 11, a copper tab or copper wire can also be used instead of an electric wire.

As the structure of this power output wire 11, a cable structure is desired especially when high flaw resistance and high wear resistance are required. However, a flat wire or ribbon wire can also be used.

More specifically, it is possible to use, e.g., a 600-V polyethylene cable (EV, EE, CV, or CE) of JIS C 3605 standard, a 600-V EP rubber insulated cable (PN•PV) of JIS C 3621 standard, a 600-V vinyl insulated vinyl sheath (flat) cable (VVR or VVF) of JIS C '3342 standard, a first-, second-, third-, or fourth-kind rubber insulated rubber cabtyre cable (1CT, 2CT, 3CT, or 4CT) of JIS C 3327 standard, a second-, third-, or fourth-kind rubber insulated chloroprene cabtyre cable (2RNCT, 3RNCT, or 4RNCT) of JIS C 3327 standard, a second-, third-, or fourth-kind EP rubber insulated chloroprene cabtyre cable (2PNCT, 3PNCT, or 4PNCT) of JIS C 3327 standard, or a vinyl insulated vinyl cabtyre cable of JIS C 3312 standard.

Power Converter

The power converter 12 converts output DC power from the solar battery module 17 into AC power. This power converter 12 is generally composed of a set-up transformer circuit, power converter circuit, control circuit, and the like.

As the set-up transformer circuit for boosting the output DC power from the solar battery module to a voltage required as an input voltage to the power converter 12, a set-up chopper circuit, voltage doubler rectification circuit, or series-parallel chopper circuit can be used. No such set-up transformer circuit may be necessary if the output voltage from the solar battery module is sufficiently high.

The power converter 12 is preferably a voltage-fed power converter which uses an IGBT or MOSFET as a switching element. A desired output voltage can be obtained by driving the gate of this switching element by a control signal from the control circuit.

Figure 17:
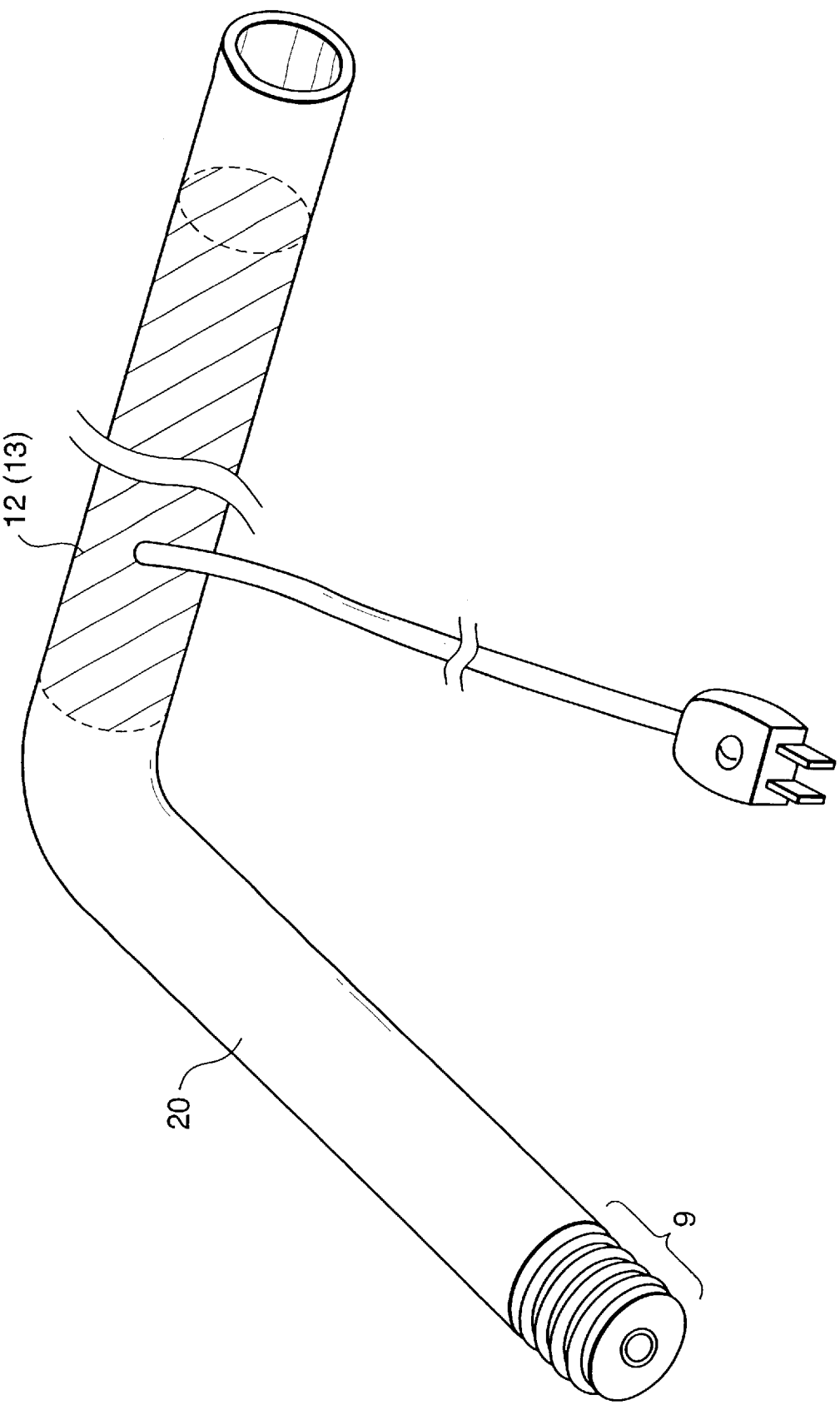
FIG. 17 is a perspective view of a locking member of the second embodiment.

FIG. 17 shows an example in which this power converter 12 is housed in the locking member 20. However, the power converter 12 can also be attached to the solar battery module 17, the locking member 20, or a fixing member, or can be separately placed.

The power converter 12 is more preferably incorporated into the locking member 20, since the power converter 12 can be replaced if it fails, the strength of the locking member 20 further increases, and the power converter 12 is protected against rain and the like.

Power Storage Device

A power storage device 13 can be a lead storage battery, nickel-hydrogen storage battery, electric double layer capacitor, or lithium ion battery, and can be selected in accordance with the system scale and storage capacity. A storage battery can be a battery capable of deep discharge and having a relatively small capacity. In particular, a nickel-hydrogen battery is capable of 100% deep discharge and has a small size and long life, and an electric double layer capacitor has a semipermanent lifetime. The terminal voltage of this storage battery is desirably substantially matched with the maximum output point voltage of the solar battery module.

FIG. 17 shows an example in which this power storage device 13 is housed in the locking member 20. However, the power storage device 13 can also be attached to the solar battery module 17, the locking member 20, or a fixing member, or can be separately placed.

The power storage device 13 is more preferably incorporated into the locking member 20, since the power storage device 13 can be replaced if it fails, the strength of the locking member 20 further increases, and the power storage device 13 is protected against rain and the like.

Locking Member

Figure 21:
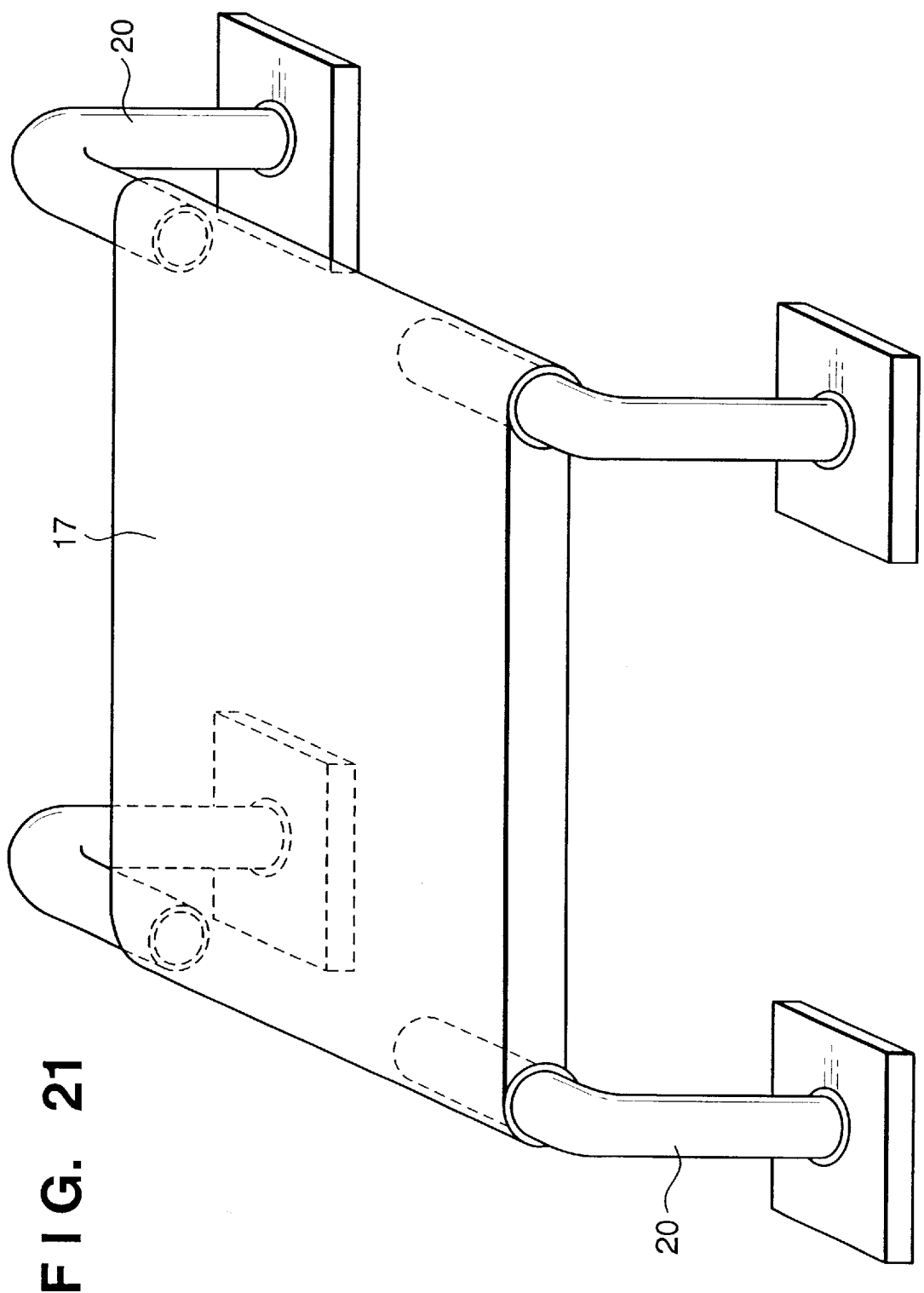
FIG. 21 is a view showing an installation example of the solar battery module of the second embodiment.

The locking members 20 fix the solar battery module 17 as shown in FIG. 21, connect solar battery modules as shown in FIG. 8, or perform the both.

As shown in FIG. 6, this locking member 20 is equipped with the electric connecting terminals 9 and thereby has both a connecting·fixing function and an electrical connecting function. The electric connecting terminals 9 are desirably formed on the surface of the locking member 20 so as to be mechanically connected or fixed and electrically connected at the same time.

As the material of this locking member 20, a metal such as aluminum, stainless steel, or iron, or plastic is used. The material of the locking member 20 can be any material as long as it can be formed into a shape capable of locking the solar battery module 17 and maintaining structural strength. If the material is a metal, however, it must be insulated from the electric connecting terminals 9.

The shape of at least a portion of the locking member 20 is desirably a circle or square. However, the locking member 20 can take any shape provided that the locking member 20 has high structural strength and can be inserted into the structure support member 6.

Figure 7:
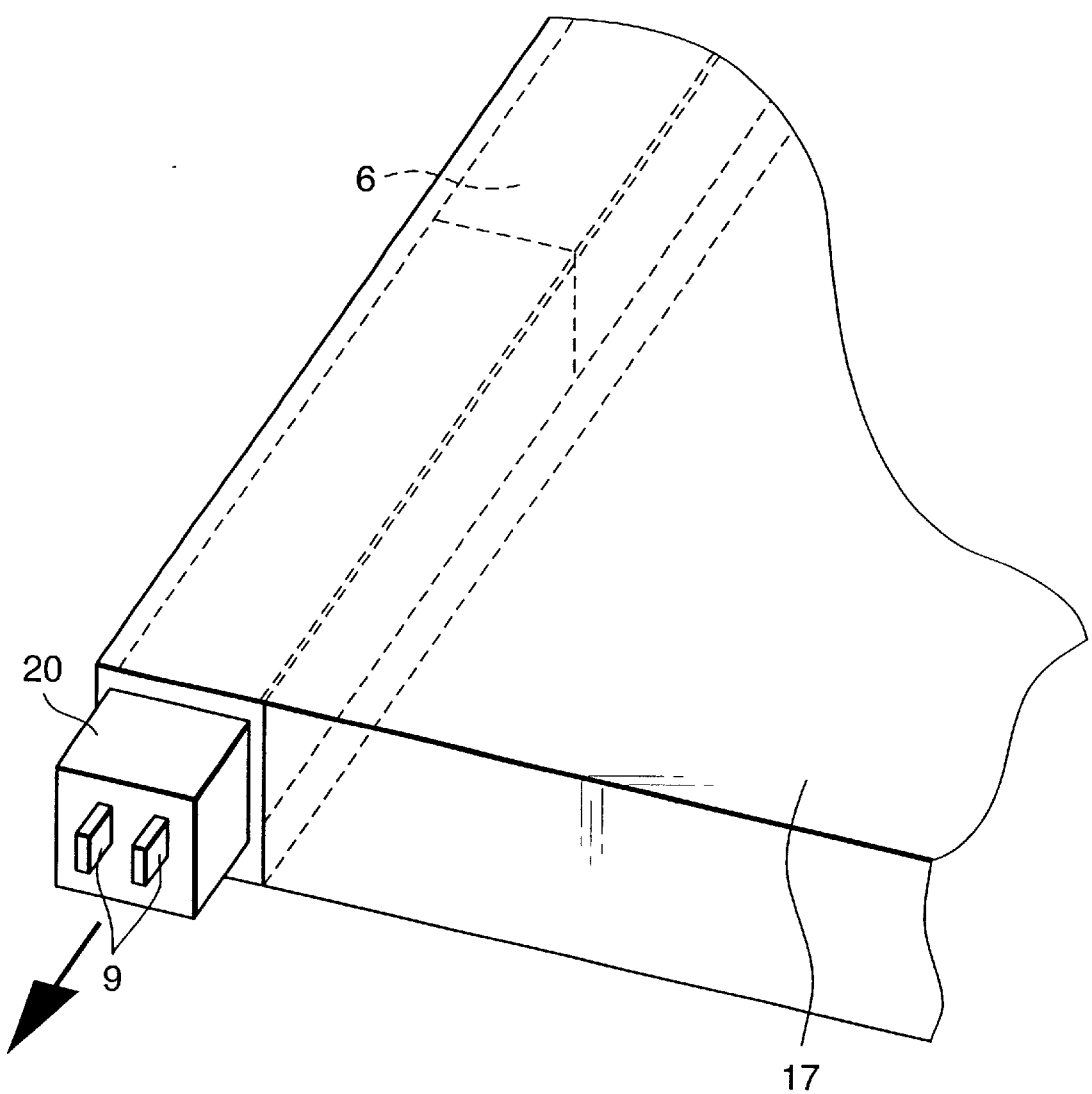
FIG. 7 is a perspective view showing the state in which the locking member of the solar battery module is accommodated.

As shown in FIG. 6, the electric connecting terminals 9 of this locking member 20 can be formed at one end of the locking member 20, and the power output wires 11 can be extracted from the other end and connected to the solar battery module 17. In this case, as shown in FIGS. 7 and 8, the locking member 20 can be previously accommodated in the structure support member 6 of the solar battery module 17, and extracted from the structure support member 6 to fix or connect the solar battery module 17 when the solar battery module 17 is installed.

Figure 24:
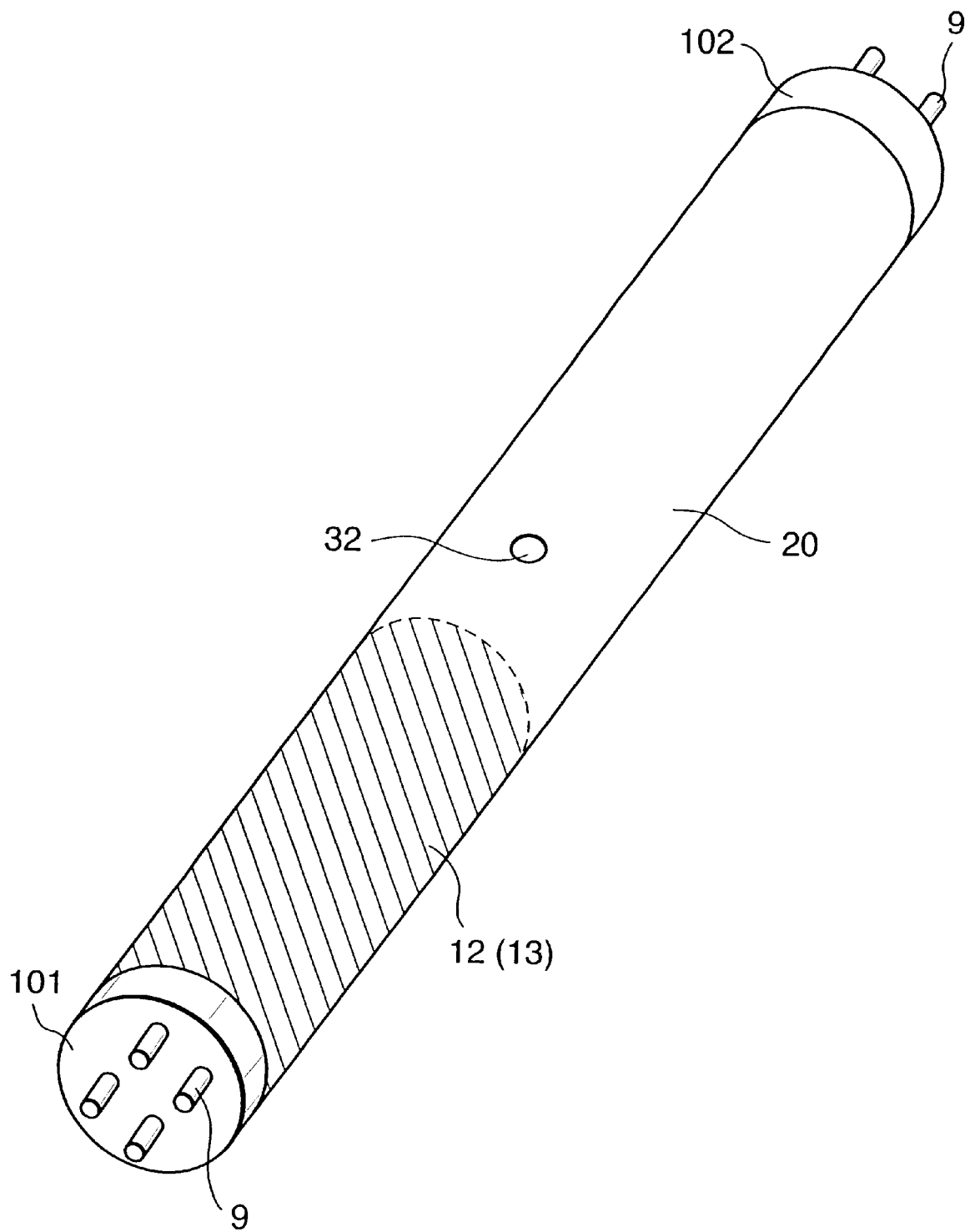
FIG. 24 is a perspective view showing a locking member of the third embodiment.

Also, as shown in FIG. 24, the electric connecting terminals 9 can also be formed at the two ends of the locking member 20. However, these electric connecting terminals 9 need not be always formed at the two ends. For example, the electric connecting terminals 9 need only be formed at a position, such as a side surface of the locking member 20, where then can electrically connect to the solar battery module 17.

Although the sectional shape of this locking member 20 is favorably closed, any shape such as a U-shape as shown in FIG. 31 can be used provided that connection or fixing is possible.

Figure 32E:
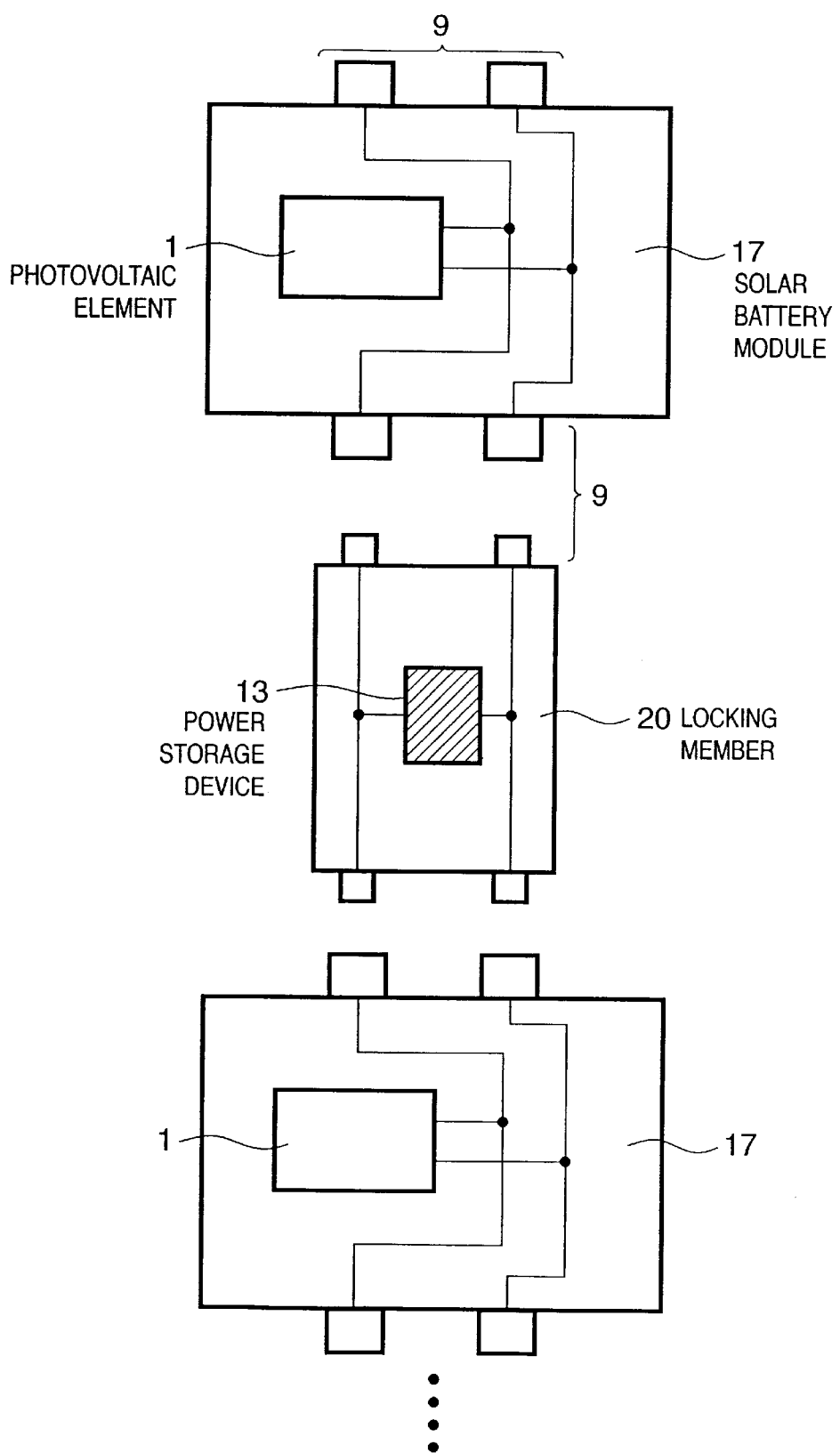

When the power converter 12 is incorporated into the locking member 20 and a plurality of solar battery modules 17 are connected, the configuration of internal circuits is as shown in FIG. 32A. When the power converter 12 is housed in the locking member 20, an output from this locking member 20 is AC power as shown in FIG. 32A, so AC output terminals are necessary as the electric connecting terminals 9. In addition, DC input terminals are necessary as the electric connecting terminals 9 for inputting DC power from the photovoltaic elements 1.

On the other hand, when the power converter 12 is placed outside the solar battery module 17 or the power storage device 13 is housed in the locking member 20, as shown in FIGS. 32B to 32E, all the electric connecting terminals 9 of this locking member 20 can be DC terminals. When the locking member 20 contains both the power converter 12 and the power storage device 13, the power storage device 13 is placed at the DC side of the power converter 12.

Note that the locking member 20 can be fixed to the solar battery module 17 and to a fixing member by bolts, or can be molded to be integrated with a fixing member.

When the locking member 20 has both DC and AC electric connecting terminals 9, it is desirable to prevent connection errors by making the shape of the DC electric connecting terminals 9 different from that of the AC electric connecting terminals 9. It is of course desirable to prevent connection errors by making the shapes of positive and negative electrodes different from each other, even when the locking member 20 has only DC electric connecting terminals 9.

Embodiments

Embodiments based on the above embodiment will be described below.

[First Embodiment]

Figure 9:
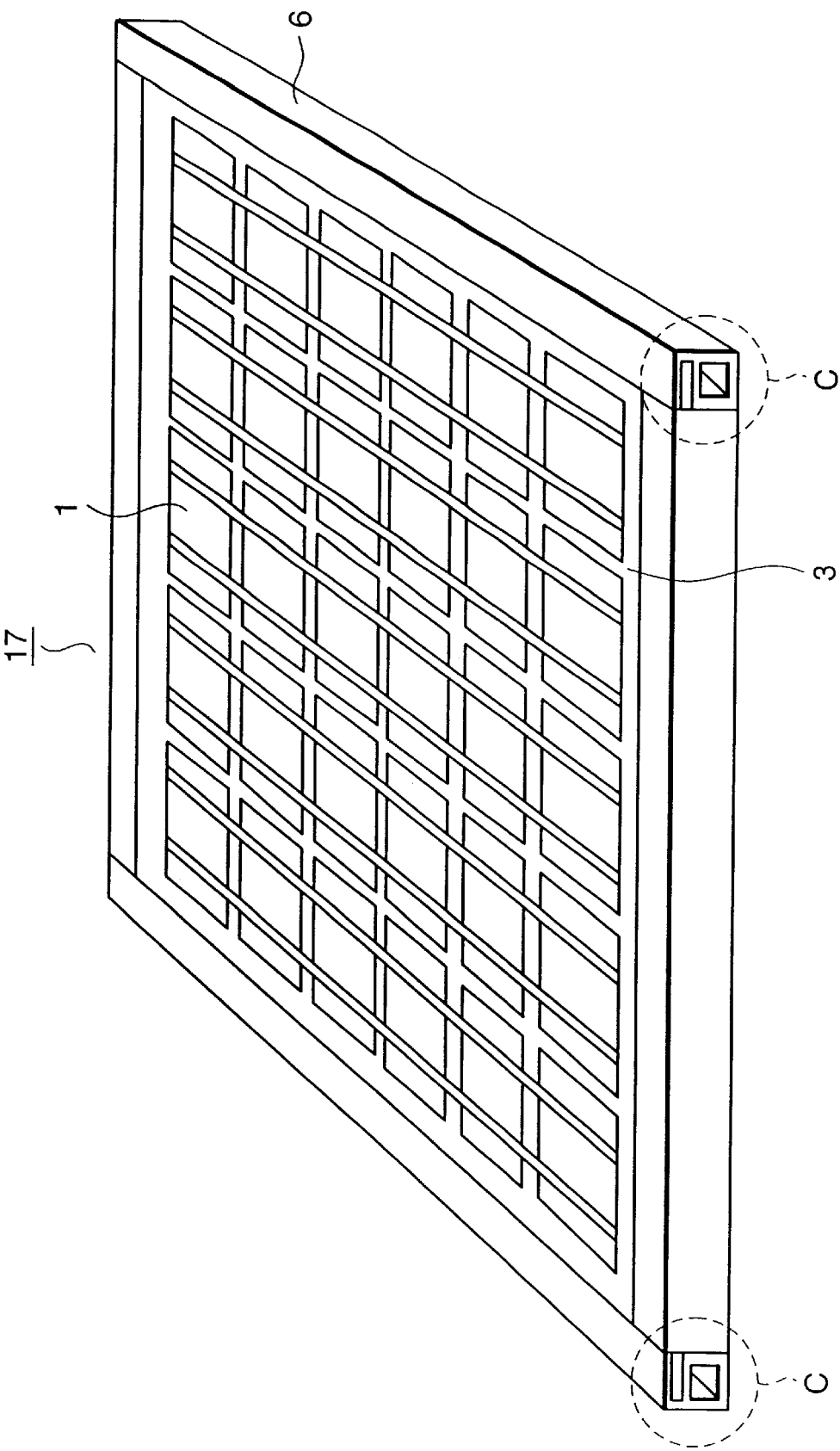
FIG. 9 is a perspective view of a solar battery module of the first embodiment.
Figure 10:
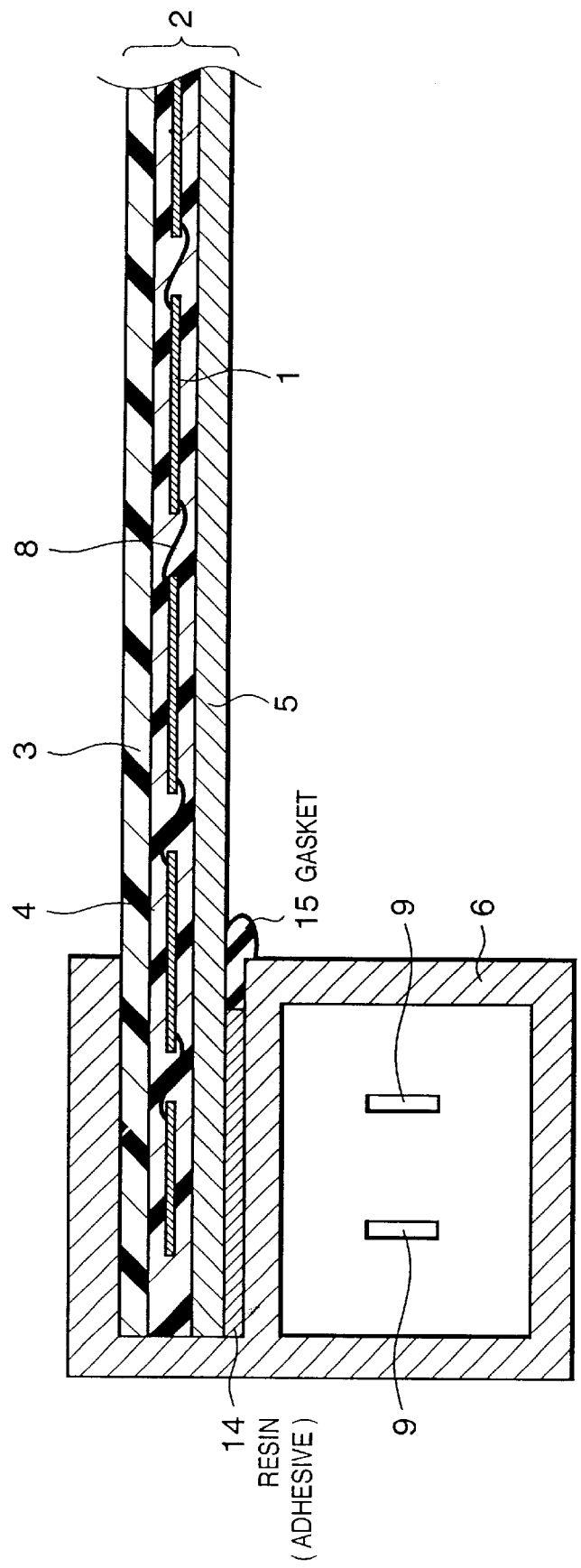
FIG. 10 is a schematic sectional view of the solar battery module of the first embodiment.

FIG. 9 is a perspective view showing the arrangement of a solar battery module 17 of the first embodiment. FIG. 10 is a schematic sectional view of this solar battery module 17 of the first embodiment. Polysilicon was used as photovoltaic elements 1 of the solar battery module 17, reinforced glass was used as a front cover 3, an EVA resin was used as a filler 4, and a film formed by sandwiching an aluminum foil between fluorine-based resins was used as a back cover 5. The polysilicon photovoltaic elements 1 were connected in series, and their output was extracted through a hole formed in the back cover 5.

A structure support member 6 made of an aluminum extruded material and having a section made up of a square and a fixed piece was attached to each edge of this solar battery module by using an adhesive 14 and a gasket 15. The section of this structure support member 6 was exposed in a direction perpendicular to the edge to which the structure support member 6 was attached.

Figure 4:
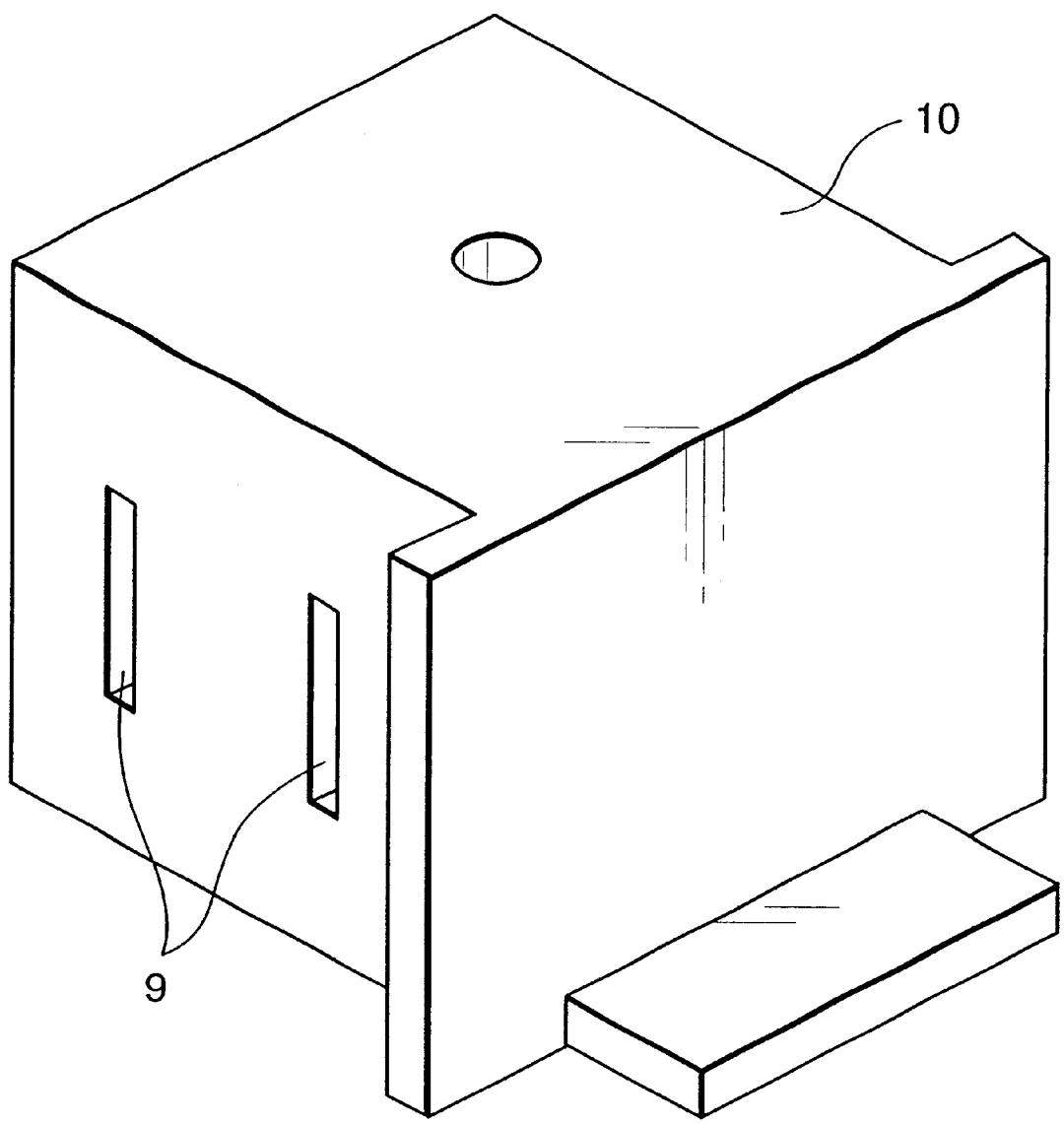
FIG. 4 is a perspective view showing an example of electric connecting terminals.

Also, an electric connecting member 10 having electric connecting terminals 9 as shown in FIG. 4 was attached to the structure support member 6.

Figure 11:
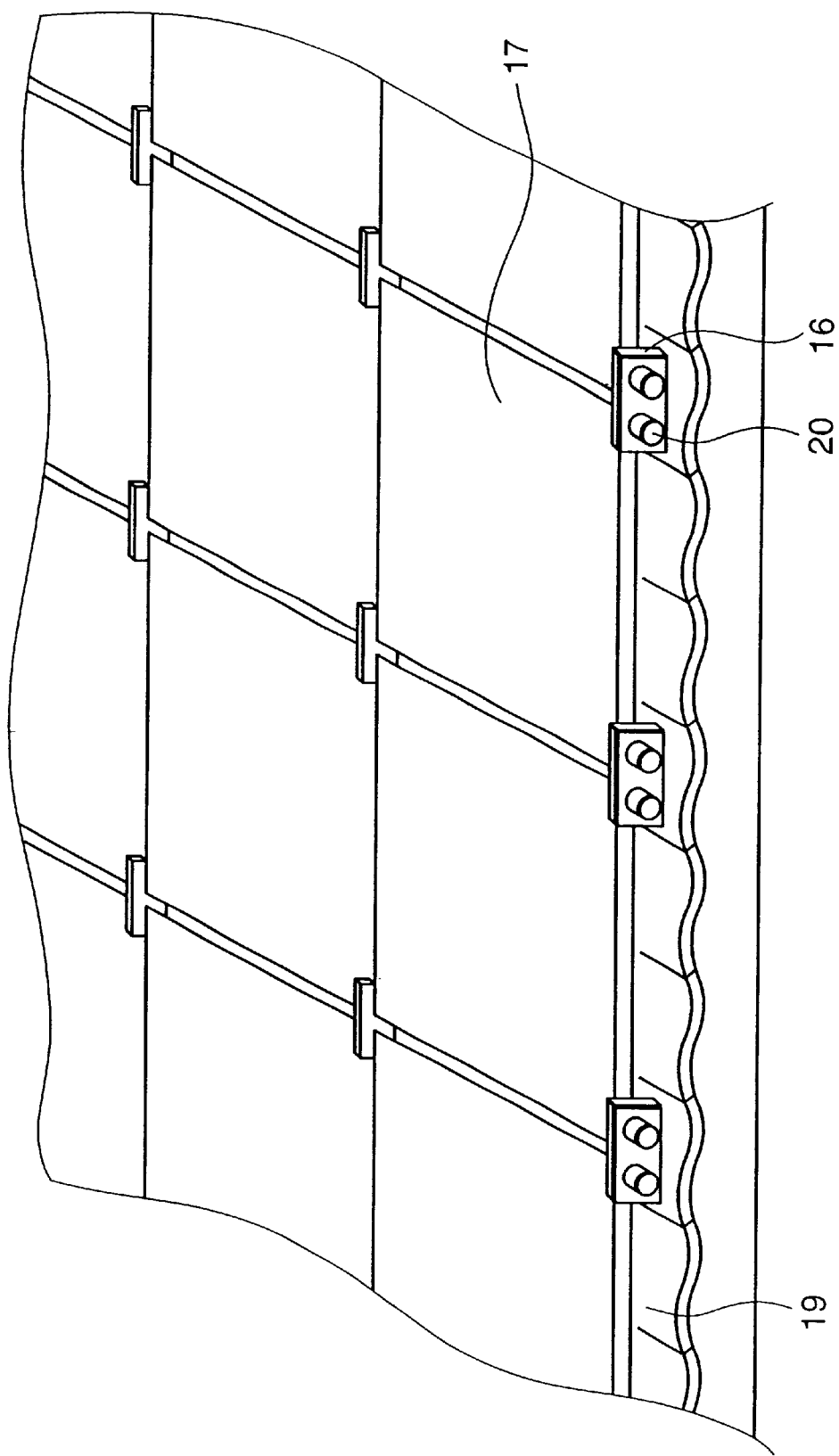
FIG. 11 is a perspective view showing the way the solar battery module of the first embodiment is installed on an existing roof surface.

As a locking member 20, as shown in FIG. 7, a square pipe having electric connecting terminals 9 attached was inserted into the section of the structure support member 6 and electrically connected. As shown in FIG. 11, these solar battery modules 17 were fixed on a roof surface 19 by mounting members 16. A power converter 12 was incorporated into each row of these solar battery modules 17 to convert a DC output from the row into an AC output.

Figure 12:
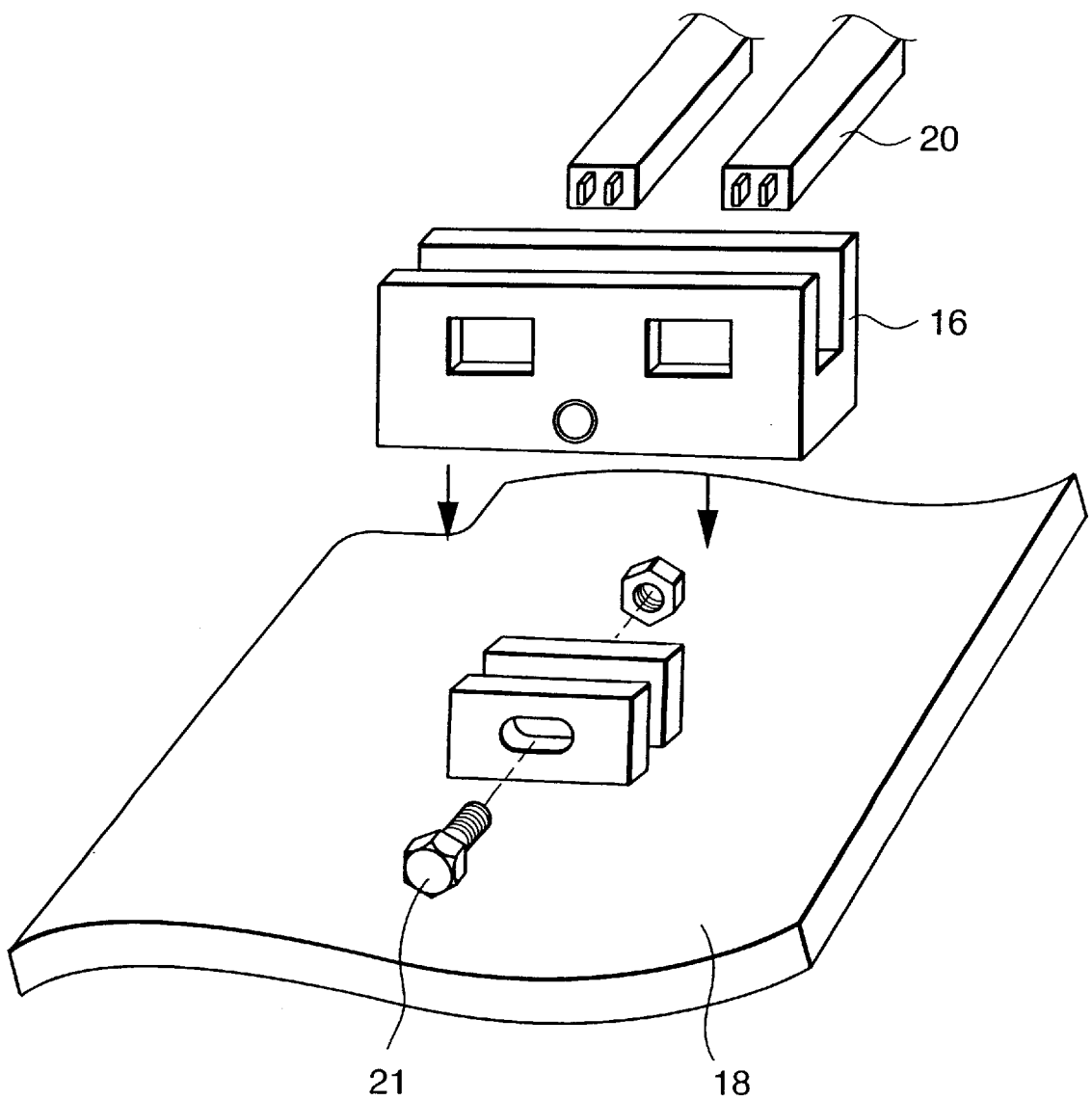
FIGS. 12 to 13D are views showing the procedure of installing the solar battery module of the first embodiment on the existing roof surface.

FIG. 12 shows an example of the mounting member 16. Through holes for inserting pipes (the locking members 20) were formed in a 2-mm thick aluminum plate. This mounting member 16 was attached to a commercially available special roofing tile 18 for mounting a solar battery module. Note that the solar battery module 17 need not be always installed on the roof surface 19 by using this special roofing tile 18. That is, it is also possible to use metal pieces which mount a solar battery module directly on a wooden shingle.

Figure 13A:
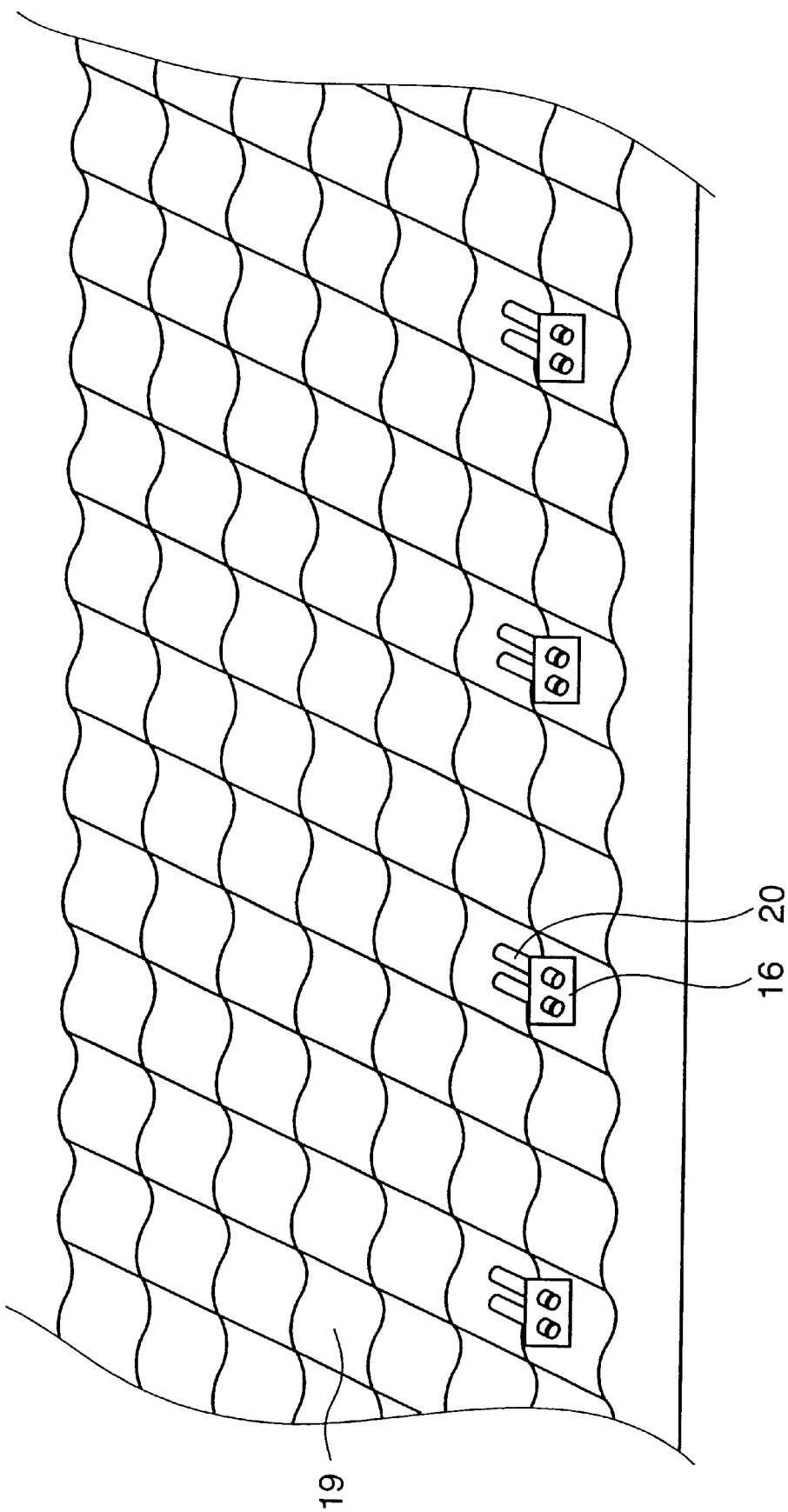
Figure 13C:
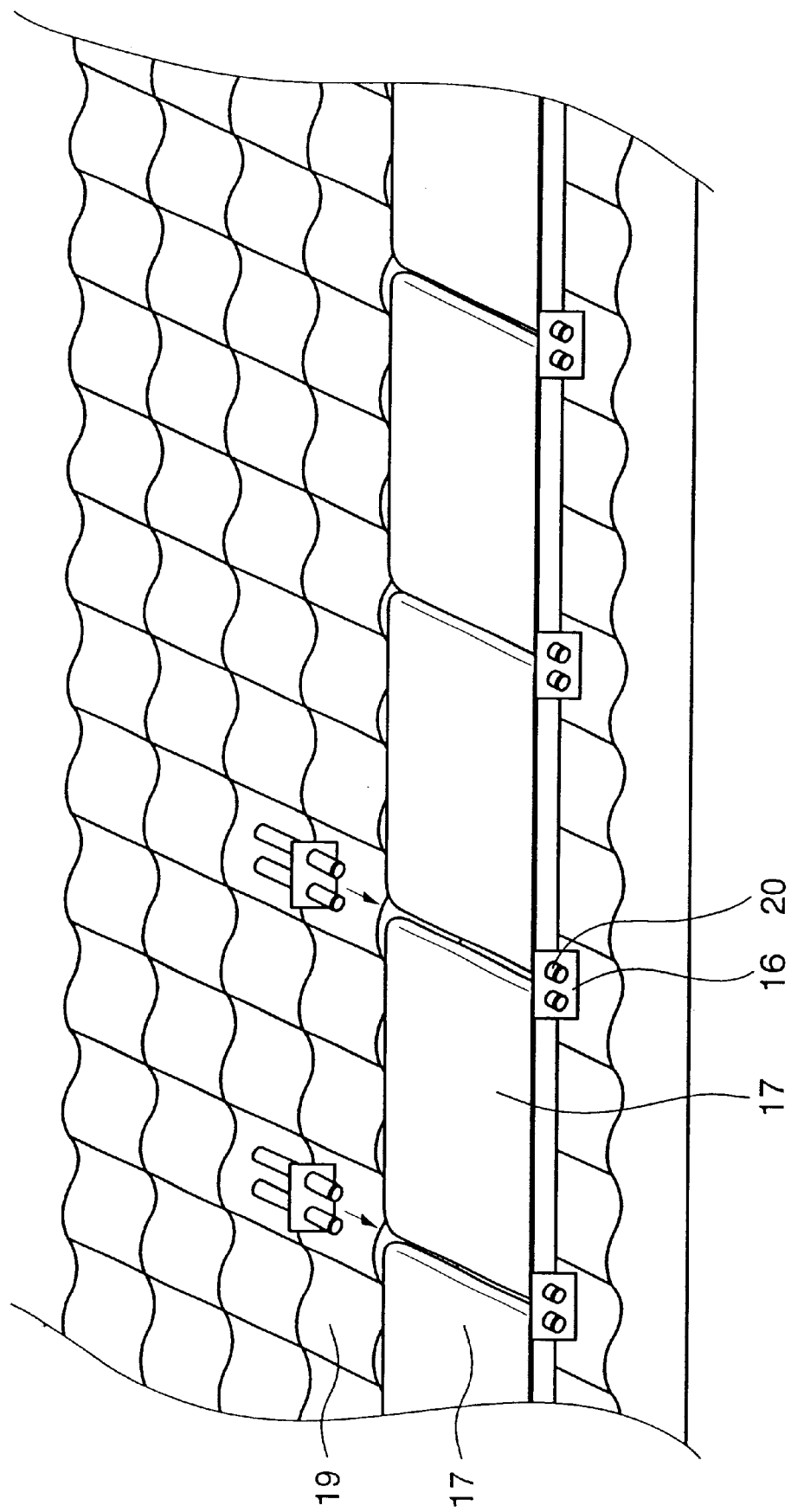
Figure 13D:
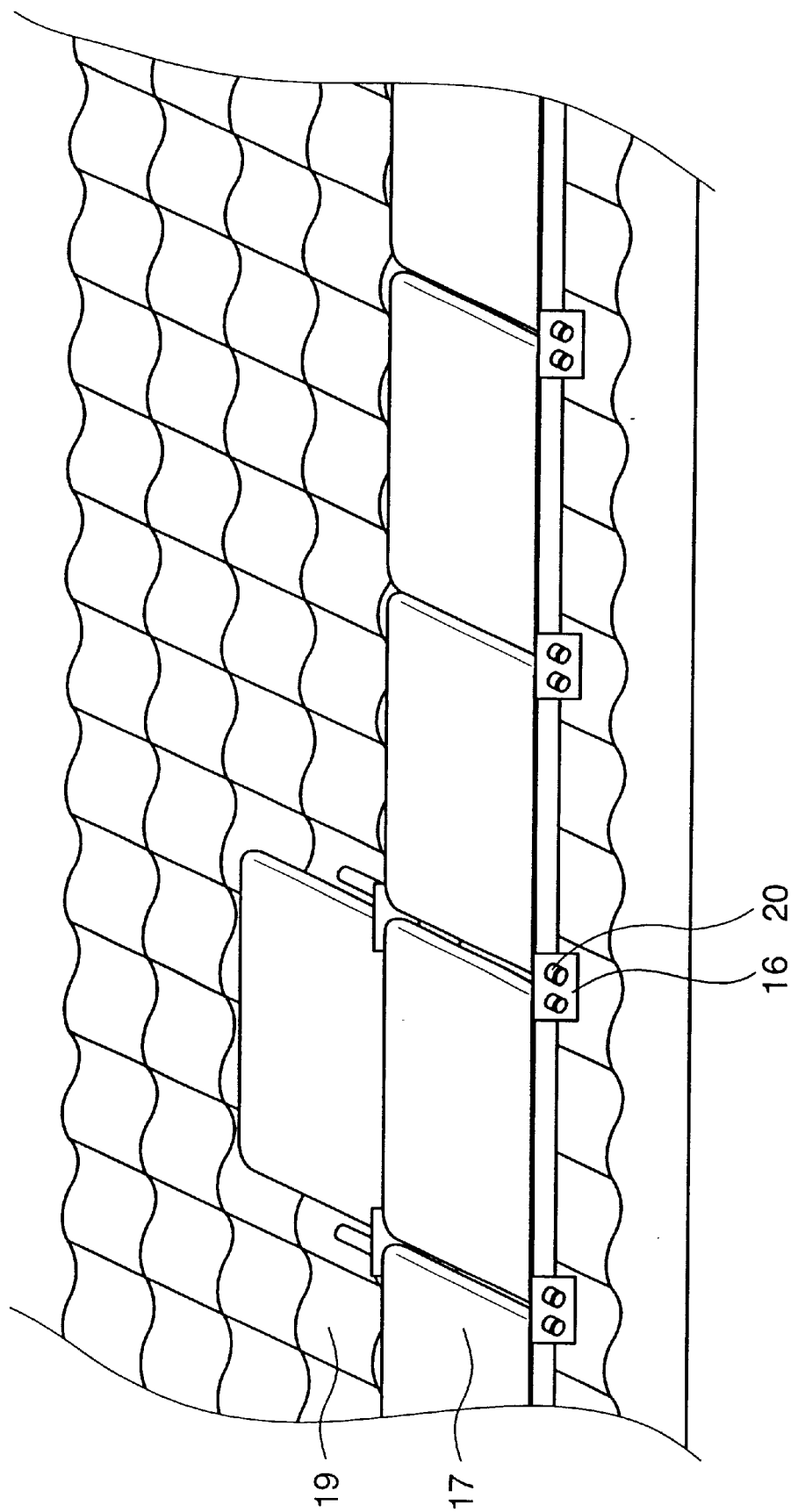

FIGS. 13A to 13D are views showing the procedure of installing the solar battery modules 17 on an existing roof surface. First, the locking members 20 attached to the mounting members 16 are arranged on the roof surface 19 (FIG. 13A). The solar battery module 17 is connected to the locking members 20 (FIG. 13B). When the solar battery modules 17 are laterally arranged in a line, the locking members 20 attached to the mounting members 16 are connected to the solar battery modules 17 (FIG. 13C). After that, another solar battery module 17 is connected (FIG. 13D).

Figure 14:
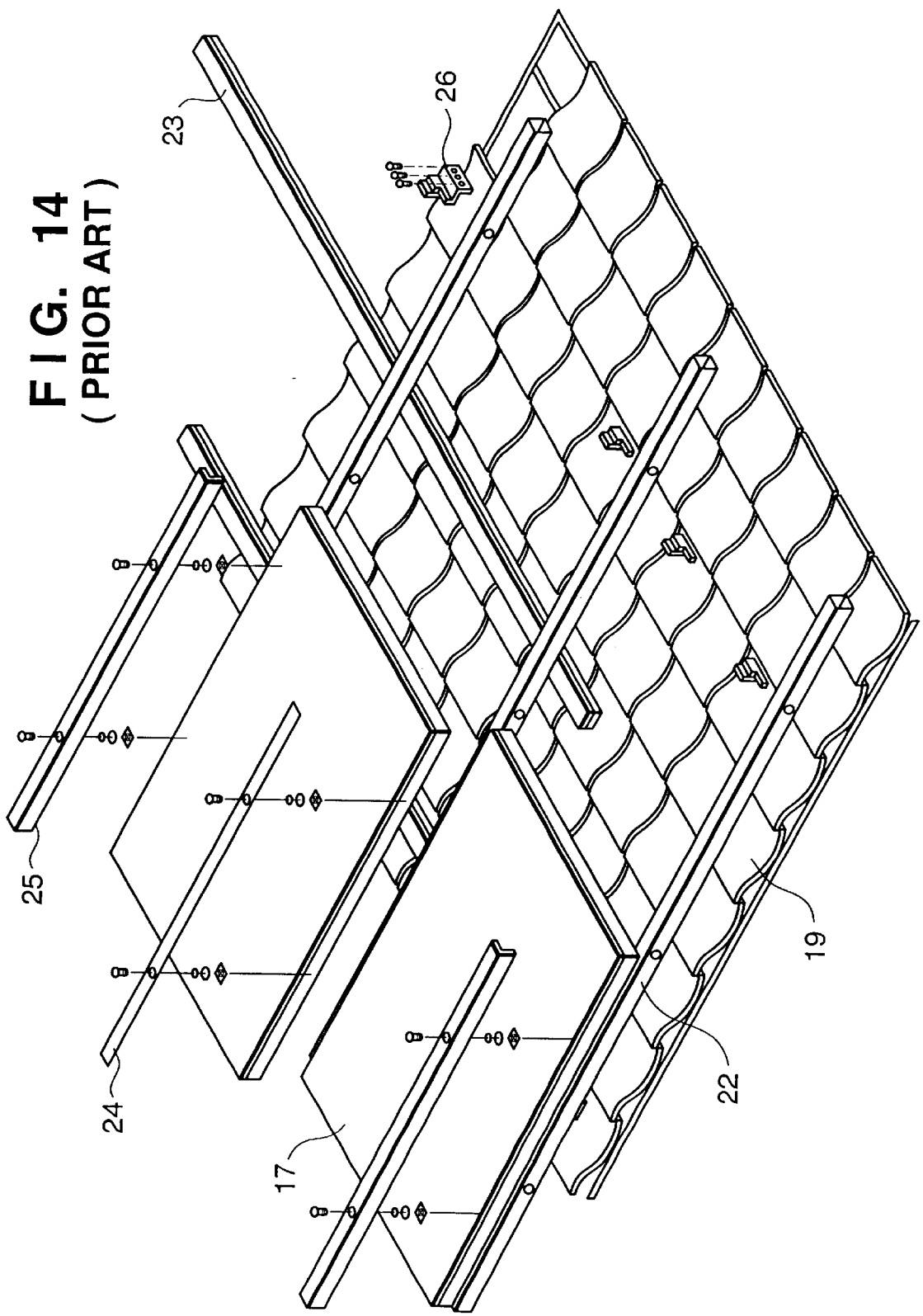
FIG. 14 is a perspective view showing the state in which a conventional solar battery module is installed on an existing roof surface.

When the solar battery modules 17 are installed on the existing roof surface 19 by the conventional method, as shown in FIG. 14, frames 22 and 23 are laid crosswise. After that, the solar battery modules 17 are mounted, and power cables are connected on the rear surfaces of these solar battery modules 17. However, the structure of this first embodiment eliminates frames and has sufficient strength against a wind load. Also, this structure facilitates electrical connections and has high water resistance because the upper portion of each connected portion is protected.

[Second Embodiment]

Figure 15:
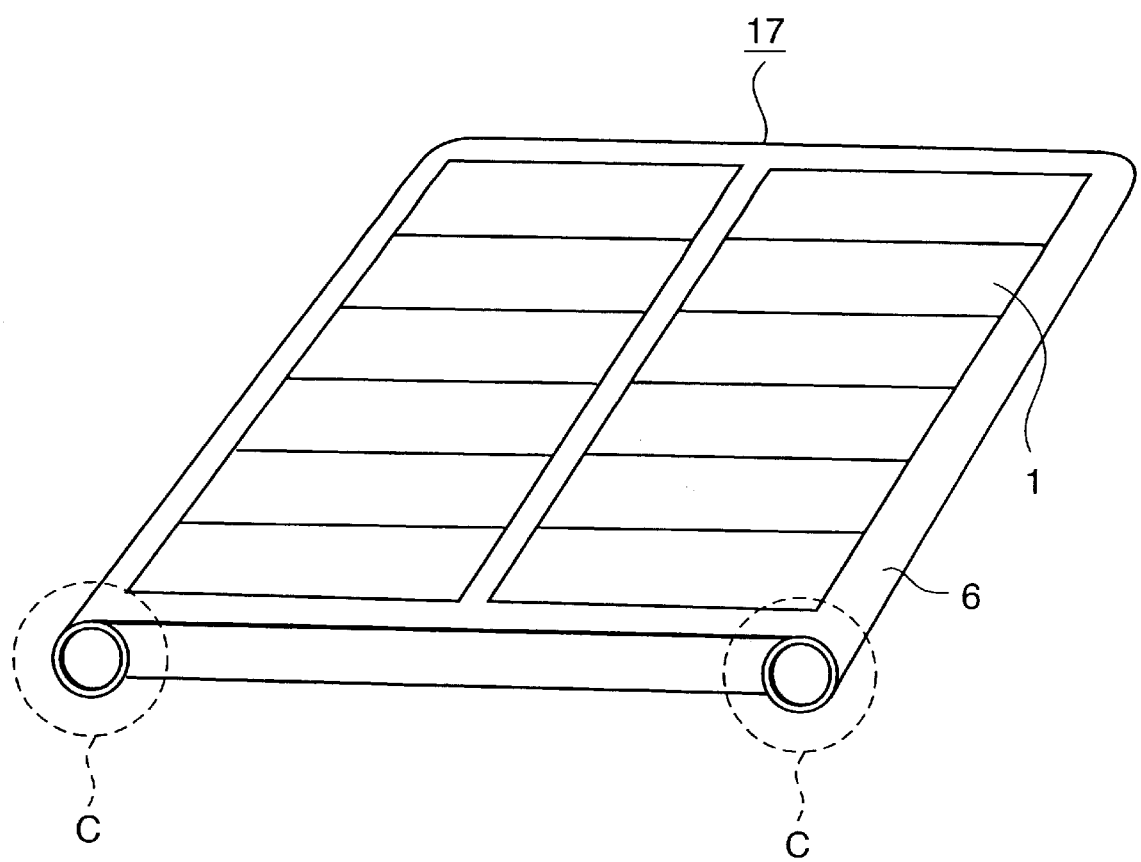
FIG. 15 is a perspective view of a solar battery module of the second embodiment.
Figure 18:
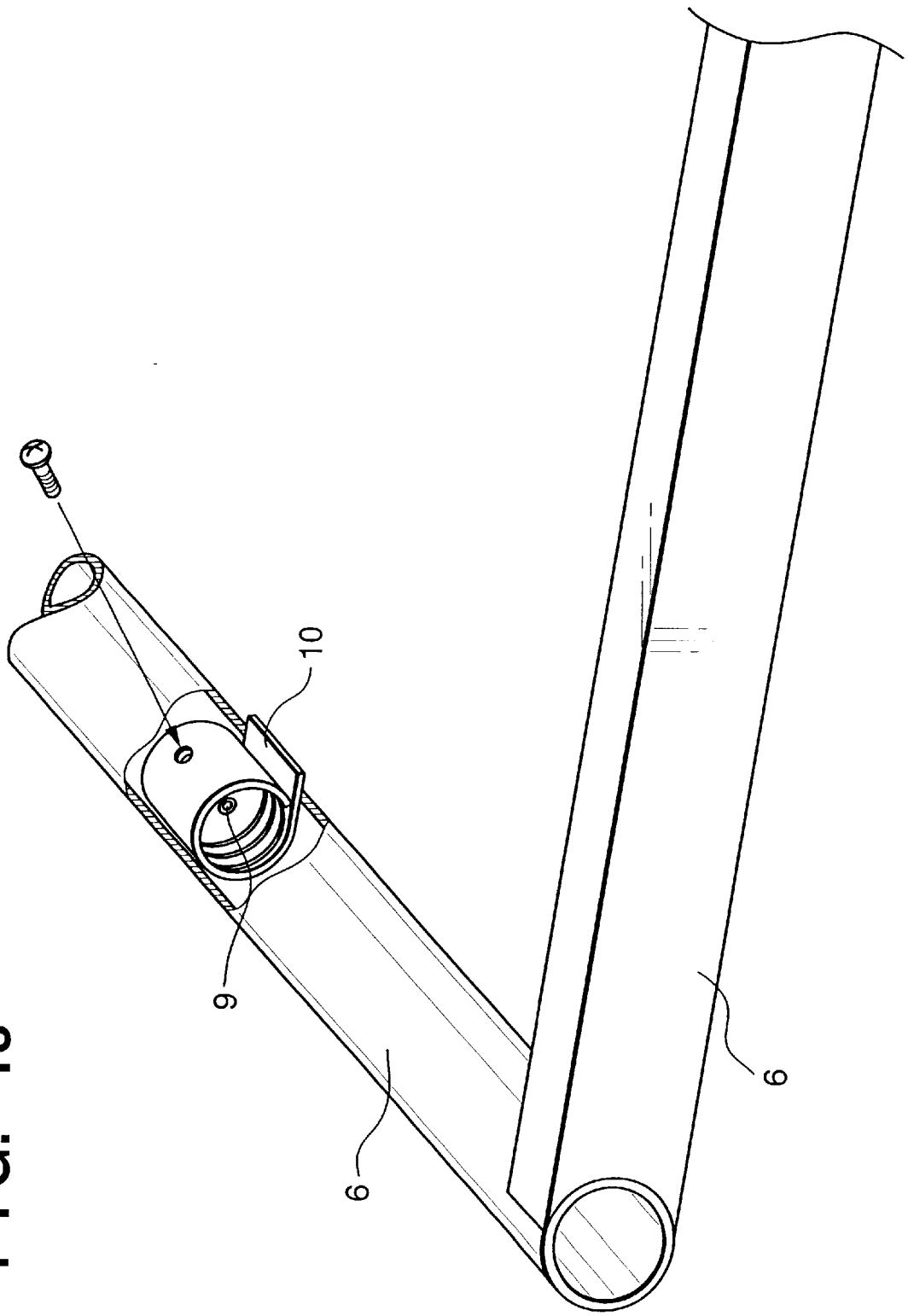
FIG. 18 is a perspective view showing the back side of the solar battery module of the second embodiment.
Figure 19:
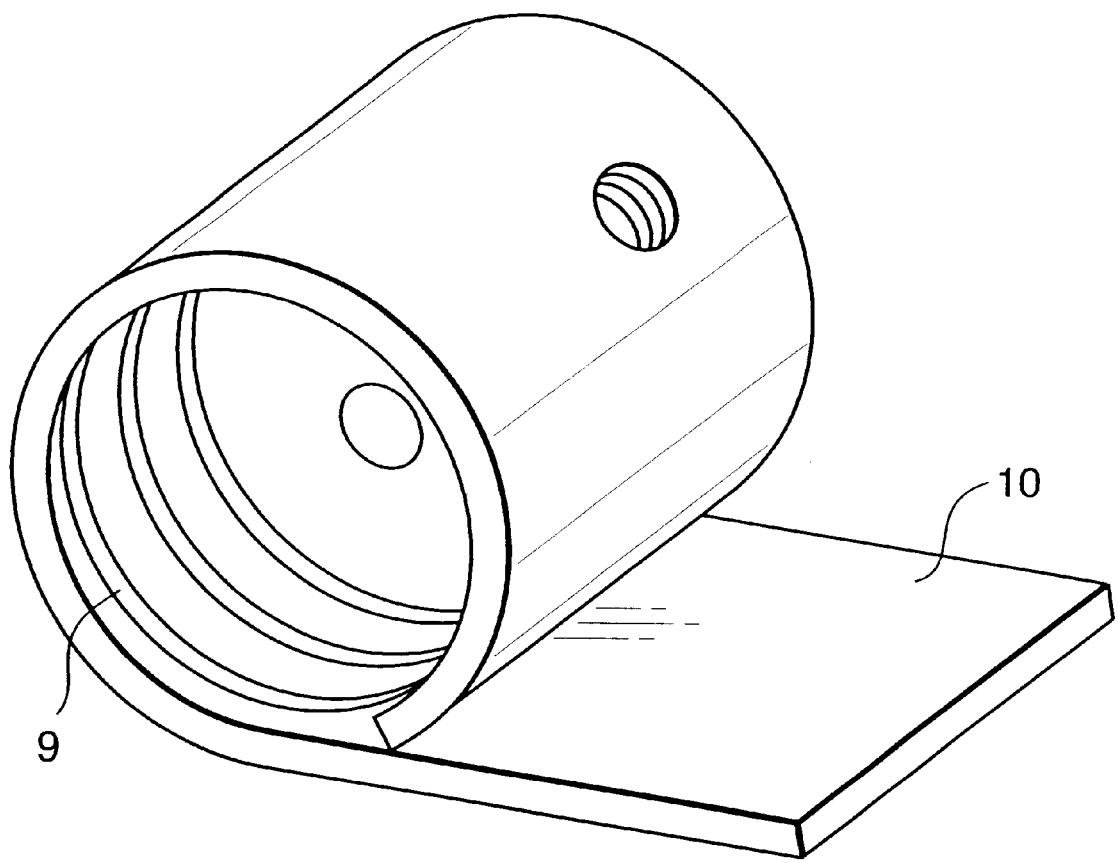
FIG. 19 is a perspective view showing an electric connecting terminal of the second embodiment.

FIG. 15 is a perspective view showing the arrangement of a solar battery module 17 of the second embodiment. FIG. 16 is a schematic sectional view of this solar battery module 17 of the second embodiment. The amorphous silicon solar batteries formed on stainless steel substrates were used as photovoltaic elements 1, a fluorine-based resin was used as a front cover 3, an EVA resin was used as a filler 4, and a molten zinc-55% aluminum alloy plated steel plate was used as a back cover 5. Amorphous silicon solar batteries were connected in series, and their output was extracted through a hole formed in the back cover 5 and soldered to a power output wire 11 beforehand. An electric connecting member 10 as shown in FIG. 19 was attached to this power output wire 11. This solar battery module 17 was bent such that two opposing edges of the solar battery module 17 were molded integrally with structure support members 6 having a section as indicated by C in FIG. 15. After that, the electric connecting member 10 was fixed to the structure support member 6 as shown in FIG. 18, and two remaining edges were bent.

A round pipe was used as a locking member 20, and a terminal 9 as shown in FIG. 17 was attached to an end portion of the pipe. A power converter 12 and a power storage device 13 were incorporated into this round pipe (locking member 20).

Figure 20:
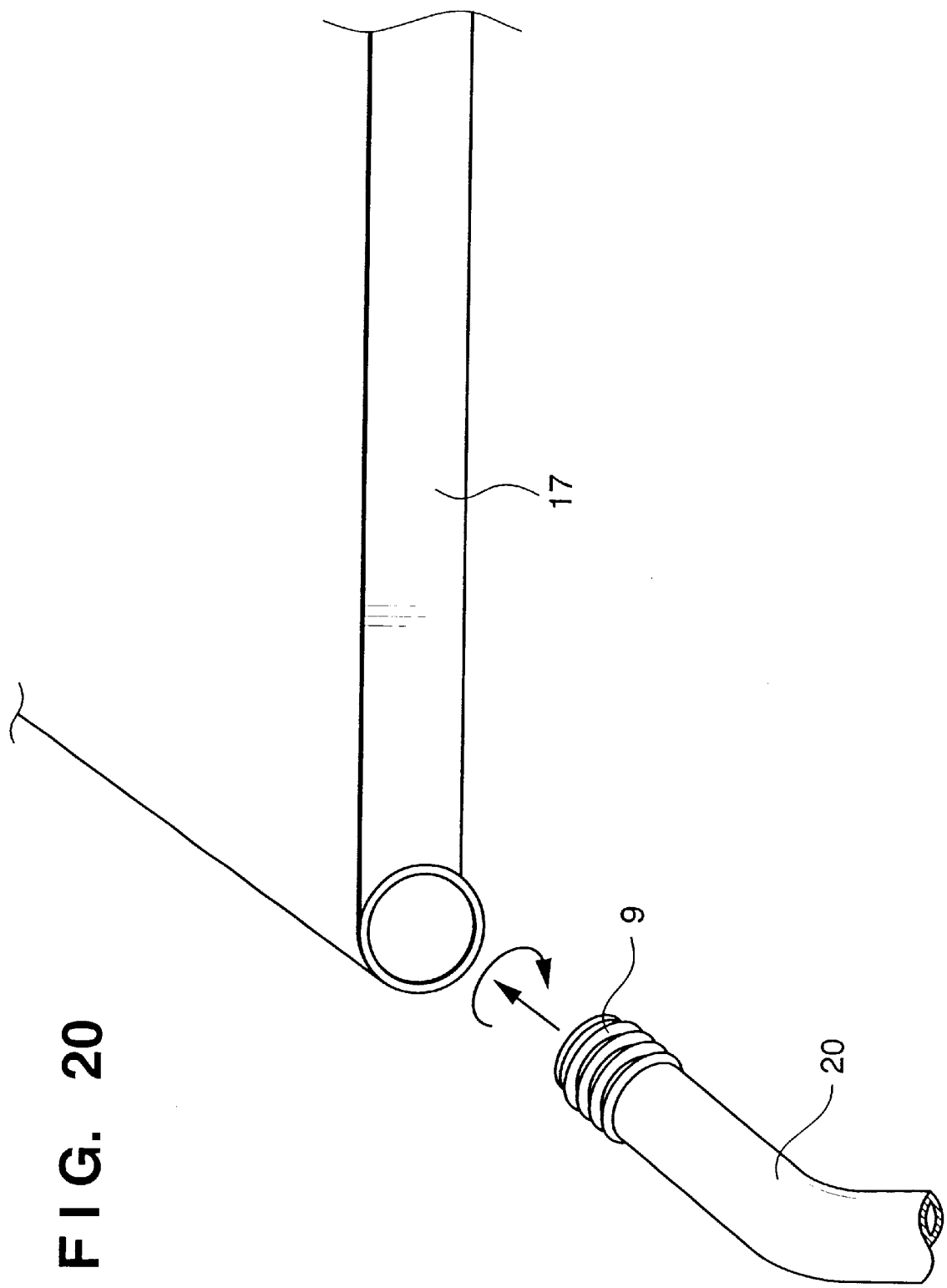
FIG. 20 is a view for explaining how to attach the locking member of the second embodiment.

As shown in FIG. 20, the bent round pipe (locking member 20) was connected to a sectional portion of the structure support member 6 of the solar battery module 17.

Other pipes were stood in holes dug in the ground, and fixed by supplying concrete. The locking members 20 were inserted into these pipes (FIG. 21).

Figure 22:
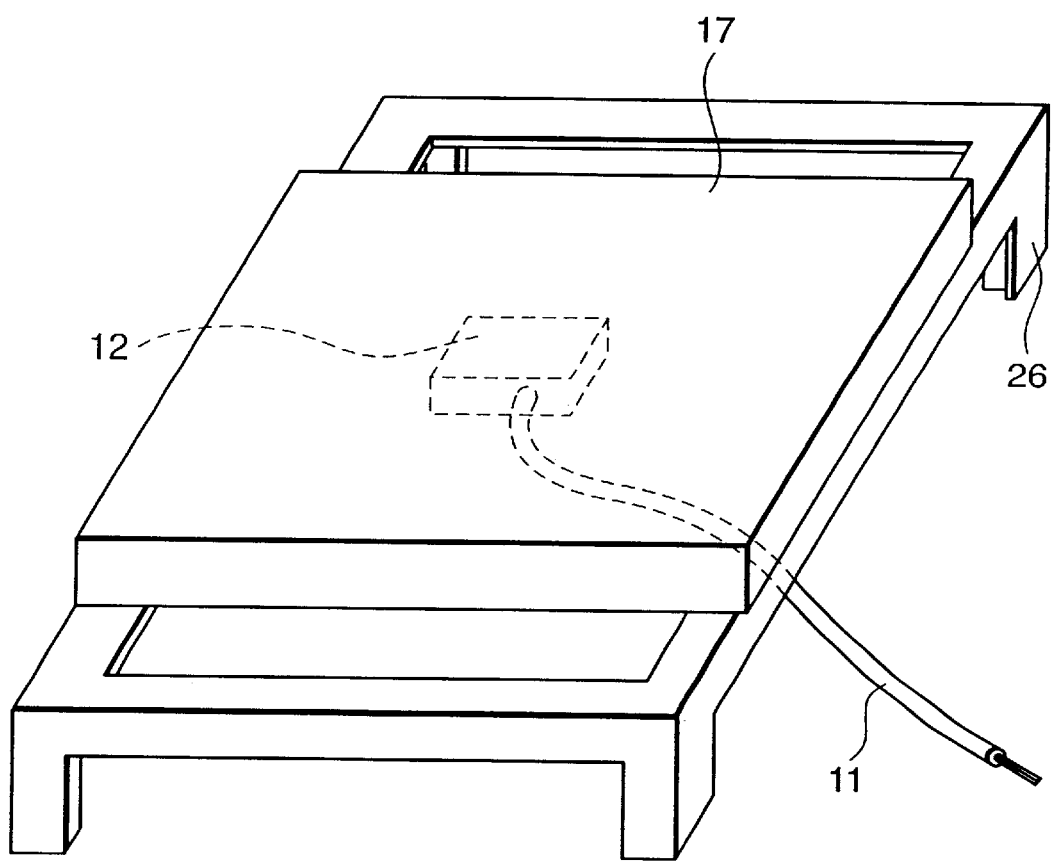
FIG. 22 is a view showing an installation example of a conventional solar battery module.

When the solar battery module 17 is to be installed on the ground by the conventional method, as shown in FIG. 22, this solar-battery module 17 is mounted on a frame formed using steel members. However, the structure of this second embodiment can simplify the structure of the frame and facilitate electrical connections.

[Third Embodiment]

FIG. 23 is a perspective view showing the arrangement of a solar battery module 17 of the third embodiment. Polysilicon was used as photovoltaic elements 1 of this solar battery module 17, reinforced glass was used as a front cover 3, an EVA resin was used as a filler 4, and a film formed by sandwiching an aluminum foil between fluorine-based resins was used as a back cover 5. The polysilicon photovoltaic elements 1 were connected in series, and their output was extracted through a hole formed in the back cover 5.

Figure 25:
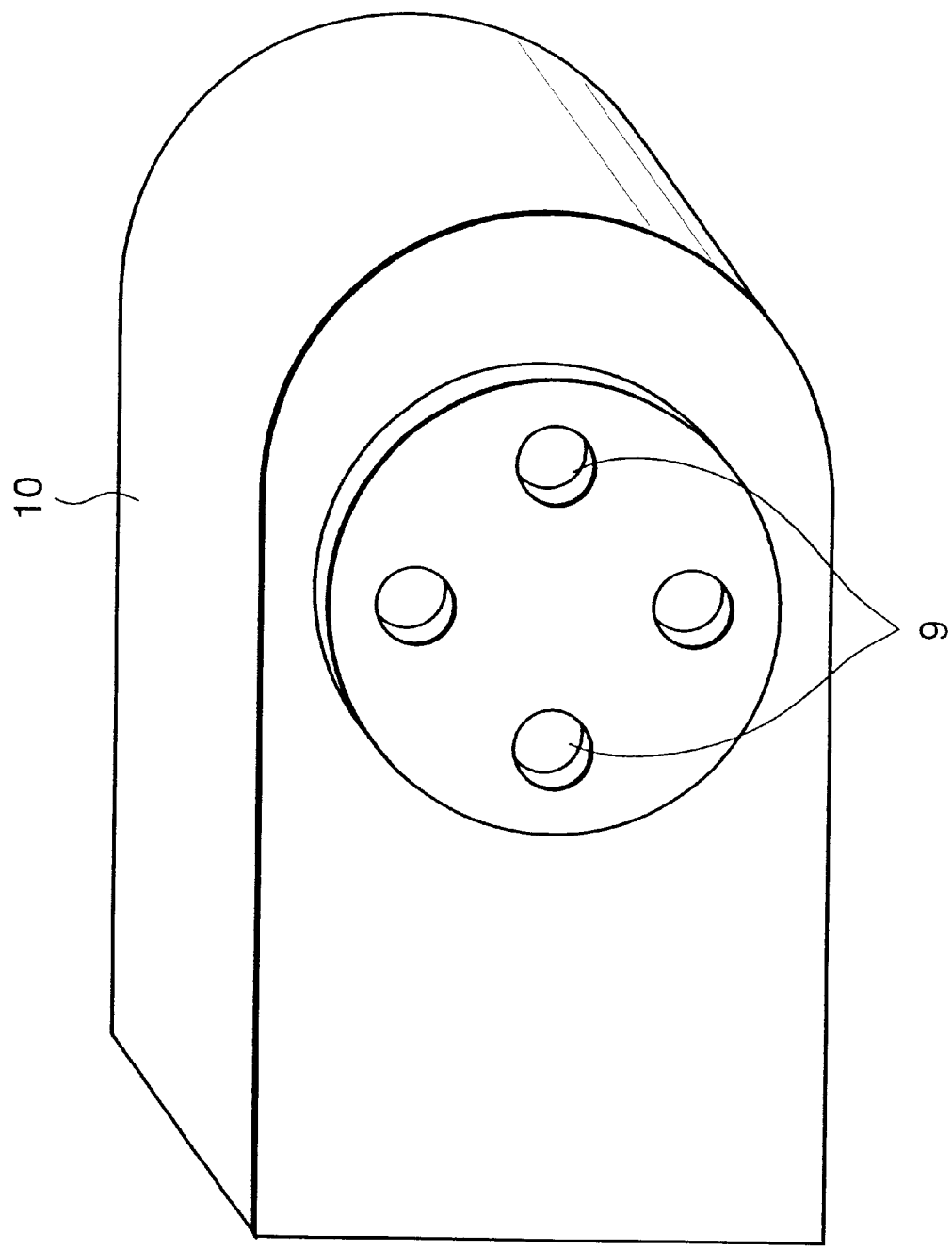
FIG. 25 is a perspective view showing electrical terminals of the third embodiment.

A structure support member 6 made of an aluminum extruded material and having a section made up of a square and a fixed piece was attached to each edge of this solar battery module by using an adhesive 14 and a gasket 15. Round holes 28 were formed in this structure support member 6, and electric connecting members 10 as shown in FIG. 25 were attached to the structure support member 6.

A locking member 20 was as shown in FIG. 24. This locking member 20 contained a power converter 12 and had an end portion 101 equipped with two DC electric connecting terminals 9 for supplying an DC output from the solar battery module 17 to the built-in power converter 12, and with two AC electric connecting terminals 9 for AC power supplied from another locking member 20 to this solar battery module 17. An end portion 102 had AC electric connecting terminals 9 for supplying output AC power from the power converter 12 to another solar battery module 17.

Figure 28:
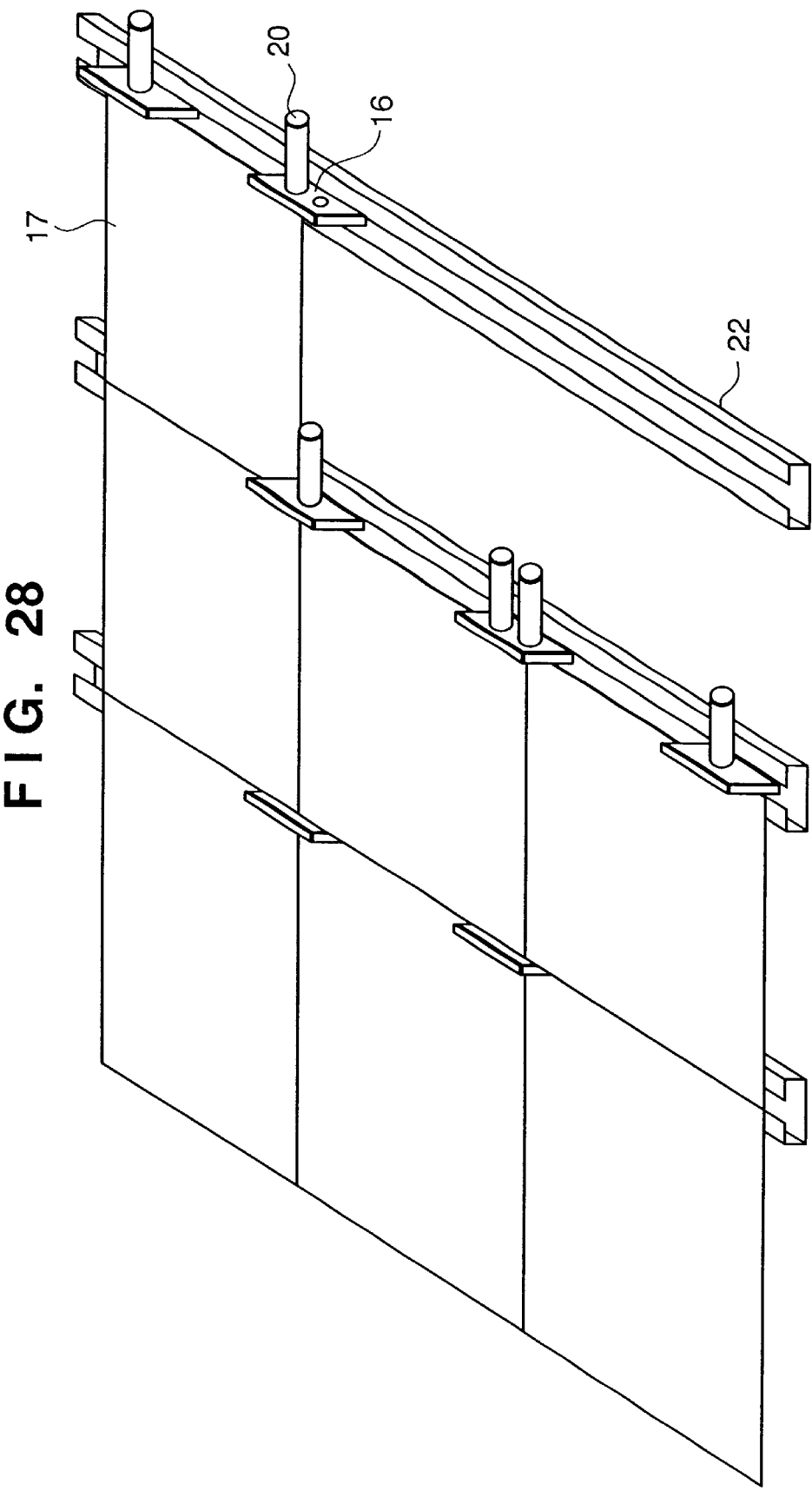
FIG. 28 is a perspective view showing an installation example of the solar battery module of the third embodiment.

As shown in FIG. 28, a plurality of such solar battery modules 17 were arranged in a matrix manner.

Figure 26:
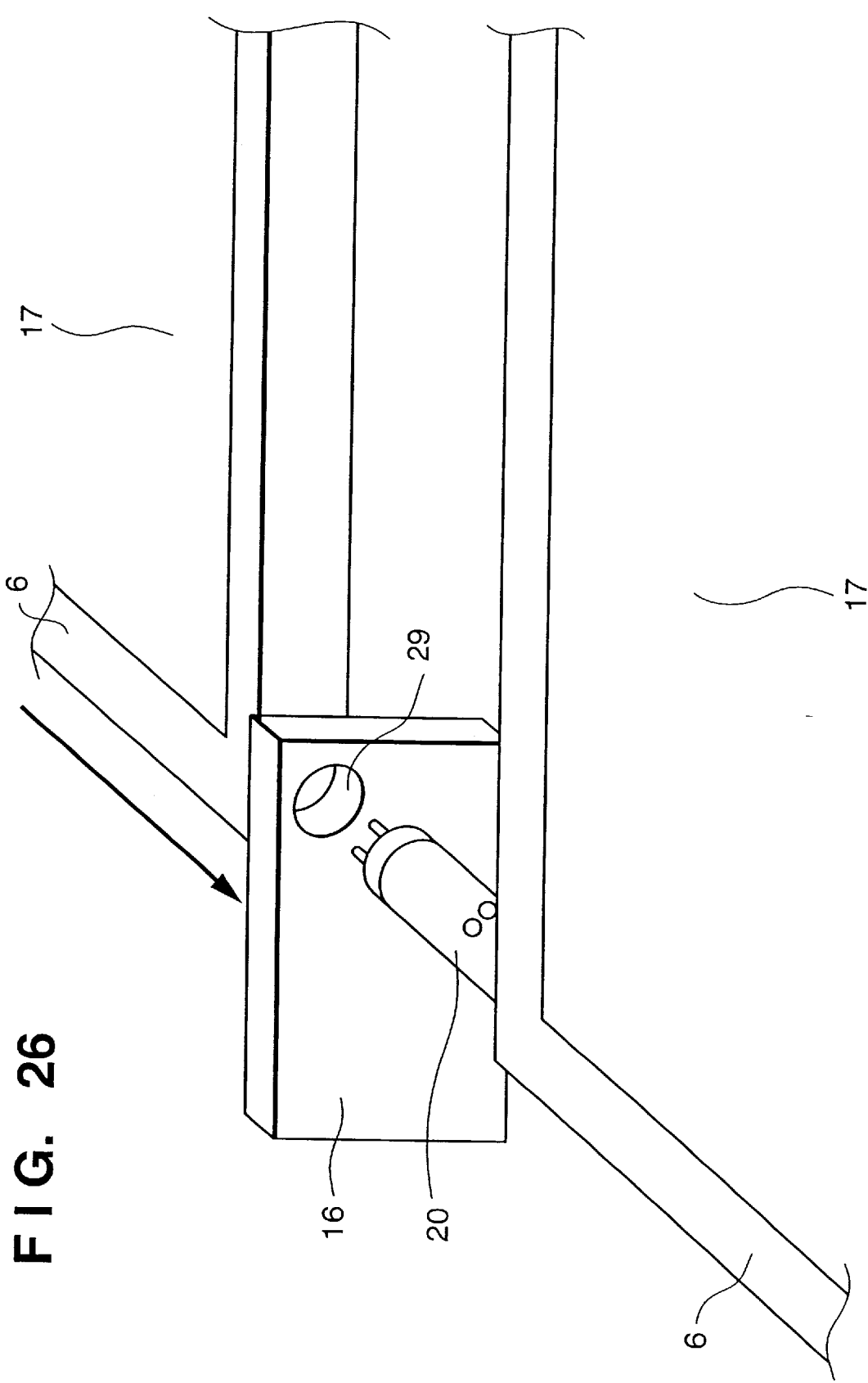
FIG. 26 is a view for explaining the procedure of installing the solar battery module of the third embodiment.
Figure 27:
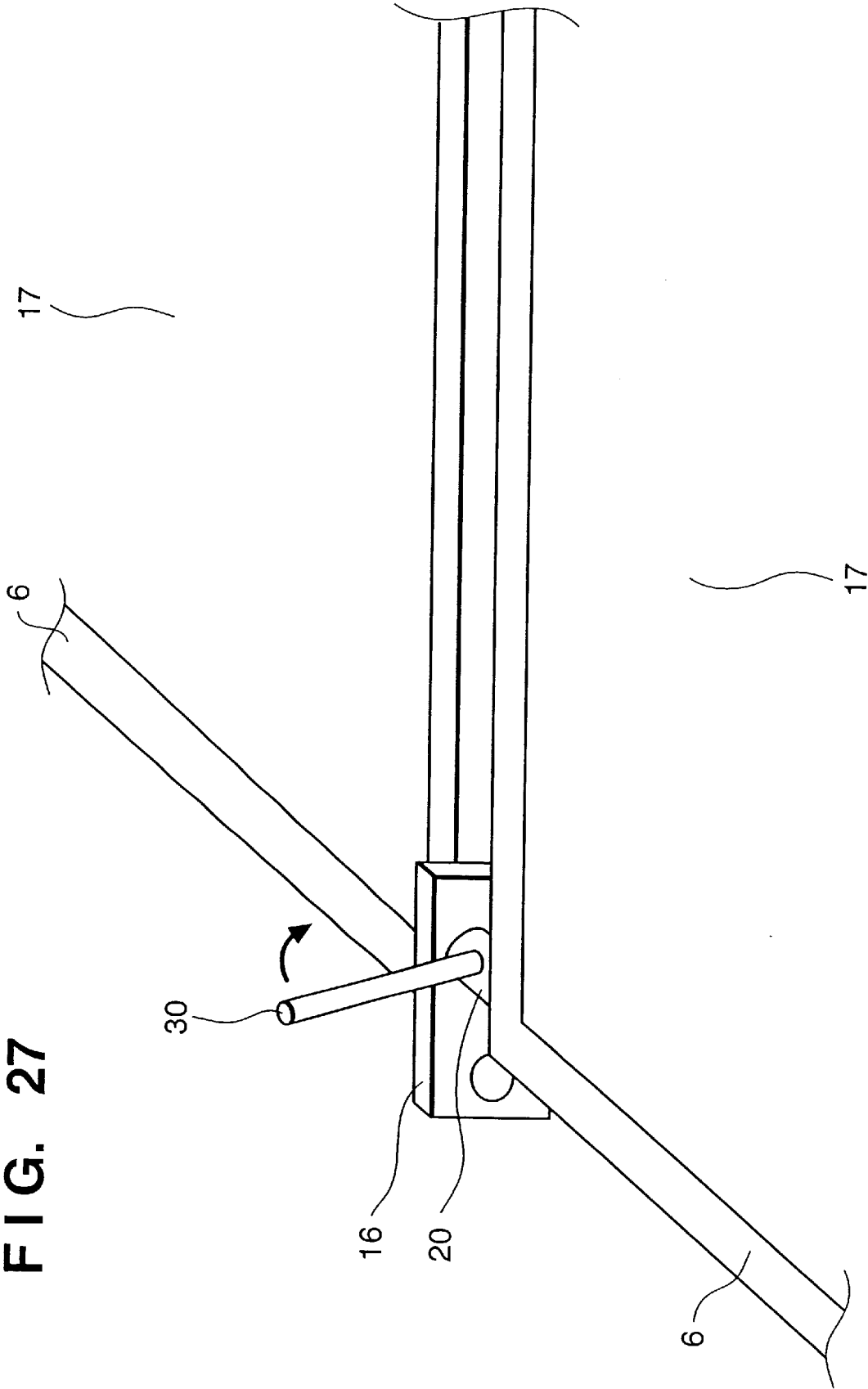
FIG. 27 is a view for explaining how to fix the locking member of the third embodiment.
Figure 29:
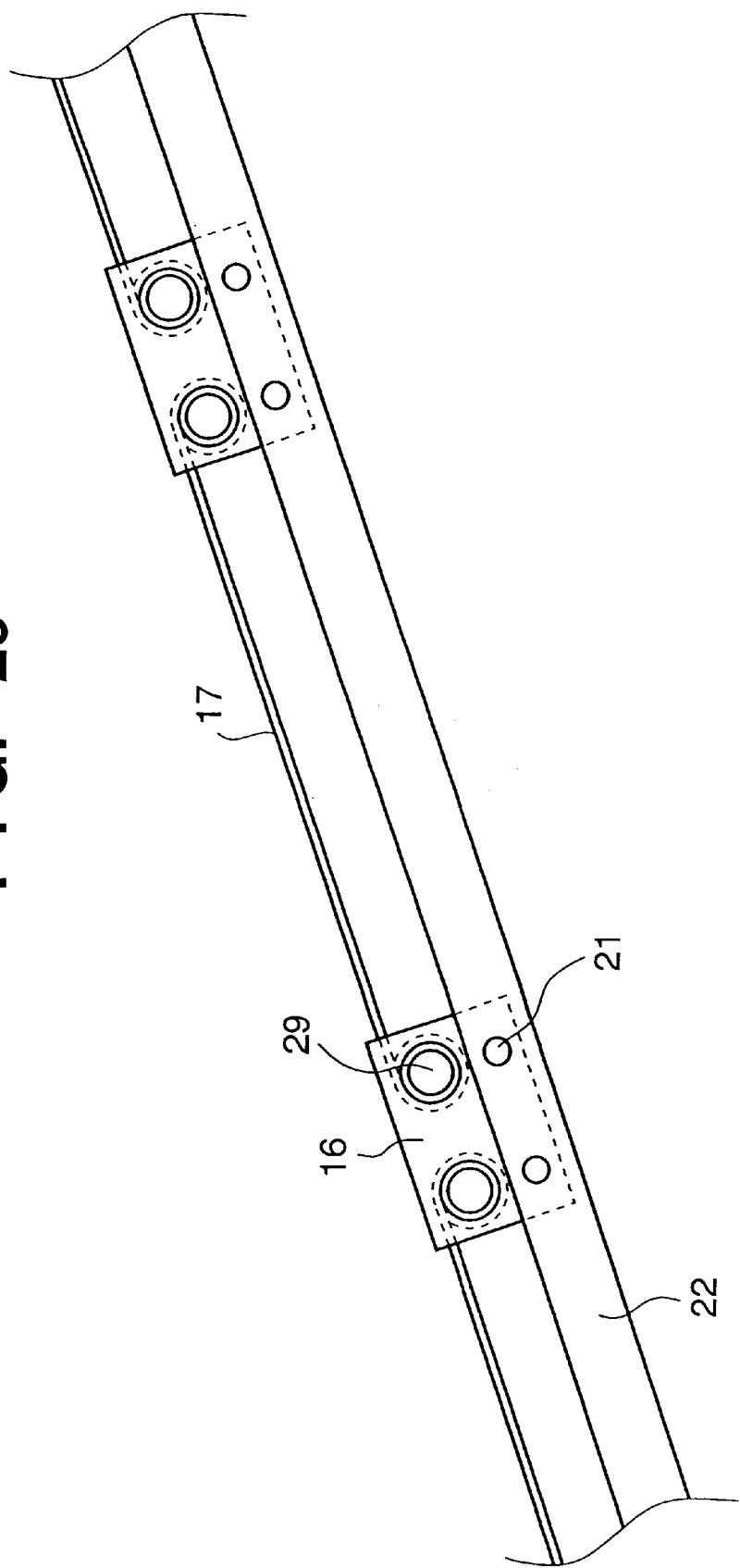
FIG. 29 is a view showing the installation example of the solar battery module of the third embodiment.

First, C channels 22 were laid in the longitudinal direction. Fixing members 16 as shown in FIG. 29 were placed in the slits of these C channels 22. As shown in FIG. 26, the locking member 20 was inserted into a through hole 29 of the fixing member 16 to thereby support the solar battery module 17. As shown in FIG. 27, a tool 30 was inserted into a fixing hole 32 of the locking member 20 to rotate and fix the locking member 20. After that, the fixing members 16 were fixed to the C channels by bolts 21 as shown in FIG. 30.

With this structure, it is possible to provide a solar generating system which has sufficient strength against a wind load and can be readily constructed.

As described above, a solar battery module, power converter, and power generating system of this embodiment can achieve the following effects.

(1) An electrical connection can be made by the locking member 20 which can be inserted into the structural strength support member 6 having sufficient strength of the solar battery module. Since this can simplify the frame structure and wiring, the number of members and the cost can be reduced.

(2) Since the locking member 20 can be manufactured by a round pipe or the like, the cost can be reduced by the use of a general-purpose product.

(3) The electric connecting terminals 9 are formed inside the structural strength support member 6. Therefore, these electric connecting terminals 9 are not broken by contact with something, and the water resistance is high.

As many apparently widely different embodiments of the present invention can be made without departing from the spirit and scope thereof, it is to be understood that the invention is not limited to the specific embodiments thereof except as defined in the appended claims.

What is claimed is:

1. A solar battery comprising a photovoltaic element;

a cover member for supporting said photovoltaic element; and a structure support member having a portion which forms an angle or a curved surface with respect to said cover member, wherein said structure support member has an opening and an electric connecting terminal, and said solar battery is fixed and/or electrically connected to the outside by inserting, into the opening, a locking member at least partially formed by a continuous body, wherein said locking member or said structure support member comprises a power converter for converting output DC power from said photovoltaic element into AC power.

2. The solar battery according to claim 1, wherein said structure support member is a continuous body continuously formed such that the shape of the opening in said structure support member is substantially a hollow section.

3. The solar battery according to claim 1, wherein a portion of said locking member is a continuous body for connection or fixing, which is formed by a column or hollow column having a rectangular or circular section.

4. The solar battery according to claim 1, wherein said locking member can be inserted into and extracted from said structure support member.

5. The solar battery according to claim 1, wherein said locking member has an electric connecting terminal to be connected to said electric connecting terminal of said structure support member.

6. The solar battery according to claim 1, wherein said locking member or said structure support member comprises a storage battery capable of storing output DC power from said photovoltaic element.

7. A solar generating apparatus comprising the solar battery according to claim 1.

8. A building comprising the solar generating apparatus according to claim 7.

9. A solar battery comprising:

a photovoltaic element;

a cover member for supporting said photovoltaic element; and a structure support member having a portion which forms an angle or a curved surface with respect to said cover member, wherein said structure support member has an opening and an electric connecting terminal, and said solar battery is fixed and/or electrically connected to the outside by inserting, into the opening, a locking member at least partially formed by a continuous body, wherein said locking member and said structure support member have not less than two pairs of electric connecting terminals different in shape.

10. A solar battery comprising:

a photovoltaic element;

a cover member for supporting said photovoltaic element; and a structure support member having a portion which forms an angle or a curved surface with respect to said cover member, wherein said structure support member has an opening and an electric connecting terminal, and said solar battery is fixed and/or electrically connected to the outside by inserting, into the opening, a locking member at least partially formed by a continuous body, wherein said locking member has a threaded portion to be threadably engaged with a threaded portion of said structure support member so as to fix said solar battery and/or electrically connect a plurality of solar batteries.

11. A solar battery comprising:

a photovoltaic element;

a cover member for supporting said photovoltaic element; and a structure support member having a portion which forms an angle or a curved surface with respect to said cover member, wherein said structure support member has an opening and an electric connecting terminal, and said solar battery is fixed and/or electrically connected to the outside by inserting, into the opening, a locking member at least partially formed by a continuous body, wherein said locking member has an electric connecting terminal to be connected to said electric connecting terminal of said structure support member, and wherein said electric connecting terminals of said locking member and said structure support member include DC and AC electric connecting terminals.

* * * * *